US012672393B2

(12) United States Patent
Hong et al.

(10) Patent No.: US 12,672,393 B2
(45) Date of Patent: Jun. 30, 2026

(54) DISPLAY DEVICE INCLUDING REFLECTIVE STRUCTURE

(71) Applicant: SAMSUNG ELECTRONICS CO., LTD., Suwon-si (KR)

(72) Inventors: Seogwoo Hong, Yongin-si (KR); Kyungwook Hwang, Seoul (KR); Hyunjoon Kim, Seoul (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 568 days.

(21) Appl. No.: 17/526,556

(22) Filed: Nov. 15, 2021

(65) Prior Publication Data

US 2022/0285581 A1 Sep. 8, 2022

Related U.S. Application Data

(60) Provisional application No. 63/156,519, filed on Mar. 4, 2021.

(30) Foreign Application Priority Data

Jun. 2, 2021 (KR) ........................ 10-2021-0071712
Aug. 31, 2021 (KR) ........................ 10-2021-0115703

(51) Int. Cl.
 *H10H 20/814* (2025.01)
 *H10H 20/831* (2025.01)
 *H10H 29/14* (2025.01)
(52) U.S. Cl.
 CPC ...... *H10H 20/814* (2025.01); *H10H 20/8312* (2025.01); *H10H 29/142* (2025.01)

(58) Field of Classification Search
None
See application file for complete search history.

(56) References Cited

U.S. PATENT DOCUMENTS

| | | | |
|---|---|---|---|
| 8,097,894 B2 | 1/2012 | Bierhuizen et al. | |
| 9,178,123 B2 | 11/2015 | Sakariya et al. | |
| 9,240,145 B2 | 1/2016 | Ichioka et al. | |
| 9,368,549 B1 * | 6/2016 | Oraw ................ | H10H 20/8506 |
| 9,825,202 B2 | 11/2017 | Schuele et al. | |

(Continued)

FOREIGN PATENT DOCUMENTS

| | | |
|---|---|---|
| CN | 104081545 A | 10/2014 |
| CN | 104838508 A | 8/2015 |

(Continued)

OTHER PUBLICATIONS

Communication dated May 20, 2022, issued by the European Patent Office in counterpart European Application No. 21210485.5.

(Continued)

*Primary Examiner* — Jessica S Manno
*Assistant Examiner* — Christopher A. Schodde
(74) *Attorney, Agent, or Firm* — Sughrue Mion, PLLC

(57) ABSTRACT

Provided is a display device including a driving substrate, a barrier layer disposed on an upper surface of the driving substrate and including a plurality of recesses, a micro-semiconductor light emitting device disposed in each of the plurality of recesses, and a side reflective structure disposed in the barrier layer and provided adjacent to a sidewall of each of the plurality of recesses.

22 Claims, 38 Drawing Sheets

(56) References Cited

U.S. PATENT DOCUMENTS

| | | | | |
|---|---|---|---|---|
| 10,115,862 | B2 | 10/2018 | Zhan et al. | |
| 10,141,485 | B1* | 11/2018 | Hur | F21S 43/15 |
| 10,211,364 | B2 | 2/2019 | Schuele et al. | |
| 10,243,097 | B2 | 3/2019 | Yuen | |
| 10,418,527 | B2 | 9/2019 | Sasaki et al. | |
| 10,475,958 | B2 | 11/2019 | Zhan et al. | |
| 10,749,083 | B2 | 8/2020 | Sasaki et al. | |
| 11,300,827 | B2 | 4/2022 | Hwang et al. | |
| 2011/0180818 | A1 | 7/2011 | Lerman et al. | |
| 2011/0233791 | A1* | 9/2011 | Mastrangeli | H01L 25/50 |
| | | | | 257/777 |
| 2014/0159064 | A1* | 6/2014 | Sakariya | H01L 25/167 |
| | | | | 257/88 |
| 2014/0306250 | A1* | 10/2014 | Gardner | H01L 33/50 |
| | | | | 257/89 |
| 2014/0367711 | A1* | 12/2014 | Bibl | H01L 24/24 |
| | | | | 257/89 |
| 2018/0315723 | A1* | 11/2018 | Singh | H01L 24/06 |
| 2018/0350871 | A1* | 12/2018 | Lee | H01L 33/504 |
| 2019/0165035 | A1* | 5/2019 | Fu | H10H 29/10 |
| 2019/0165321 | A1 | 5/2019 | Choi et al. | |
| 2019/0179222 | A1* | 6/2019 | Choy | H01L 25/0753 |
| 2019/0181304 | A1 | 6/2019 | Sasaki et al. | |
| 2019/0252312 | A1* | 8/2019 | Yu | H01L 25/075 |
| 2020/0144228 | A1 | 5/2020 | Brick et al. | |
| 2020/0152826 | A1 | 5/2020 | Lee et al. | |
| 2020/0212278 | A1* | 7/2020 | Takenaga | H01L 33/32 |
| 2021/0013186 | A1* | 1/2021 | Chen | H01L 25/0753 |
| 2021/0020619 | A1 | 1/2021 | Iguchi et al. | |
| 2021/0091257 | A1 | 3/2021 | Hwang et al. | |
| 2021/0119079 | A1 | 4/2021 | Hwang et al. | |
| 2021/0132263 | A1 | 5/2021 | Daeschner et al. | |
| 2021/0313305 | A1 | 10/2021 | Bibl et al. | |
| 2022/0013400 | A1 | 1/2022 | Hwang et al. | |
| 2022/0102602 | A1 | 3/2022 | Hwang et al. | |
| 2022/0149254 | A1* | 5/2022 | Schuele | H01L 25/0753 |
| 2022/0189810 | A1 | 6/2022 | Hwang et al. | |
| 2022/0189931 | A1 | 6/2022 | Hwang et al. | |
| 2022/0190193 | A1 | 6/2022 | Hong et al. | |
| 2023/0154967 | A1* | 5/2023 | Pilkington | H01L 25/0753 |
| | | | | 257/40 |
| 2024/0234385 | A1 | 7/2024 | Sakariya et al. | |

FOREIGN PATENT DOCUMENTS

| | | |
|---|---|---|
| CN | 109994512 A | 7/2019 |
| CN | 111146315 B | 7/2020 |
| CN | 111933653 A | 11/2020 |
| CN | 112259572 A | 1/2021 |
| DE | 10 2017 114 011 A1 | 12/2018 |
| JP | 6159477 B2 | 7/2017 |
| KR | 102217791 B1 | 2/2021 |
| KR | 10-2021-0157093 A | 12/2021 |
| KR | 10-2022-0007500 A | 1/2022 |
| KR | 10-2022-0013739 A | 2/2022 |
| KR | 10-2022-0041484 A | 4/2022 |
| KR | 10-2022-0085687 A | 6/2022 |
| KR | 10-2022-0085689 A | 6/2022 |

OTHER PUBLICATIONS

Communication dated Oct. 29, 2024, issued by the China National Intellectual Property Administration in Chinese Application No. 202210197693.2.

* cited by examiner

131b'
131a'
131'

231c  231a  231b

231

210

DISPLAY DEVICE INCLUDING REFLECTIVE STRUCTURE

CROSS-REFERENCE TO RELATED APPLICATIONS

This application claims the benefit of U.S. Provisional Application No. 63/156,519, filed on Mar. 4, 2021, in the US Patent and Trademark Office and Korean Patent Application No. 10-2021-0071712, filed on Jun. 2, 2021, in the Korean Intellectual Property Office, and Korean Patent Application No. 10-2021-0115703, filed on Aug. 31, 2021, in the Korean Intellectual Property Office, the disclosures of which are incorporated herein in their entireties by reference.

BACKGROUND

1. Field

Example embodiments of the present disclosure relate to display devices having a reflective structure, and more particularly, to a display device using a semiconductor light emitting device as a pixel.

2. Description of Related Art

As light emitting diodes (LEDs) consume less power and are eco-friendly, industrial demand therefor has increased, and LEDs have also been applied as pixels of display devices, as well as being used as backlights of lighting devices or liquid crystal displays (LCDs). Recently, micro LED display devices using a micro-unit LED chip as a pixel has been developed. In manufacturing a display device using a micro LED chip in a micro unit, a laser lift off or a pick and place method is used as a method of transferring a micro LED. However, with this method, productivity decreases as a size of the micro LED is reduced and a size of a display device increases.

SUMMARY

One or more example embodiments provide display devices manufactured to have a large area using a fluidic self-assembly method.

One or more example embodiments also provide display devices having a reflective structure, which may be manufactured in a fluidic self-assembly manner, reduces crosstalk between adjacent pixels, and improve light efficiency.

Additional aspects will be set forth in part in the description which follows and, in part, will be apparent from the description, or may be learned by practice of example embodiments of the disclosure.

According to an aspect of an example embodiment, there is provided a display device including a driving substrate, a barrier layer disposed on an upper surface of the driving substrate and including a plurality of recesses, a micro-semiconductor light emitting device disposed in each of the plurality of recesses, and a side reflective structure disposed in the barrier layer and provided adjacent to a sidewall of each of the plurality of recesses.

The side reflective structure may be disposed such that the sidewall of the recess is disposed between the micro-semiconductor light emitting device and the side reflective structure, and a distance from the sidewall of the recess to the side reflective structure may be within a range from 0.1 μm to 50 μm.

A width of the side reflective structure in a direction parallel to the upper surface of the driving substrate may be within a range from 1 μm to a value smaller than a width of the micro-semiconductor light emitting device.

The side reflective structure may include a metallic material.

The side reflective structure may extend from an upper surface of the barrier layer to a lower surface of the barrier layer.

The side reflective structure may be configured to reflect light emitted from the micro-semiconductor light emitting device.

The display device may further include a lower reflective structure having a hydrophilic surface and disposed on a bottom of each of the plurality of recesses.

An area of the lower reflective structure may be larger than an area of each of the plurality of recesses, and a portion of the barrier layer may be disposed above a portion of an upper surface of the lower reflective structure.

The lower reflective structure may be disposed such that the upper surface of the lower reflective structure is in contact with a lower surface of the side reflective structure.

The lower reflective structure may include a reflective metal layer and an insulating layer disposed on the reflective metal layer, the insulating layer having a hydrophilic surface.

A thickness of the reflective metal layer in a normal direction of the upper surface of the driving substrate may be within a range of 50 nm to 1 □m.

The reflective metal layer may include a plurality of reflective metal layers respectively disposed in the plurality of recesses, and a single insulating layer may be disposed on the upper surface of the driving substrate and on the plurality of reflective metal layers.

The reflective metal layer may include at least one of metals among aluminum (Al) or silver (Ag).

The lower reflective structure may include a first dielectric layer and a second dielectric layer being repeatedly alternately stacked, and the first dielectric layer may have a first refractivity index and the second dielectric layer may have a second refractive index different from the first refractive index.

A thickness of the lower reflective structure in a normal direction of the upper surface of the driving substrate may be within a range of 500 nm to 2 μm.

The display device may further include a hydrophobic pattern disposed on an upper surface of the barrier layer and including a material same as a material of the side reflective structure.

A lower surface of the micro-semiconductor light emitting device in contact with a bottom surface of each of the plurality of recesses may have hydrophilicity The micro-semiconductor light emitting device may include a first electrode and a second electrode disposed on an upper surface thereof.

Each of the plurality of recesses may include a first trap region having a space in which the micro-semiconductor light emitting device moves and a second trap region having a shape and size in which the micro-semiconductor light emitting device is seated, the second trap region being connected to the first trap region.

A size of the first trap region may be set such that two or more of the micro-semiconductor light emitting devices do not enter each of the plurality of recesses.

A width of the second trap region may be within a range from 100% to about 105% of a width of the micro-semiconductor light emitting device.

The display device may further include a wavelength conversion layer configured to convert a wavelength of light emitted from the micro-semiconductor light emitting device.

According to another aspect of an example embodiment, there is provided a display device including a driving substrate, a plurality of micro-semiconductor light emitting devices disposed on an upper surface of the driving substrate, a protective layer disposed on the upper surface of the driving substrate and the plurality of micro-semiconductor light emitting devices, and a side reflective structure disposed inside the protective layer and adjacent to a periphery of each of the plurality of micro-semiconductor light emitting devices.

A width of the side reflective structure in a direction parallel to the upper surface of the driving substrate may be within a range from 1 □m to a value smaller than a width of the micro-semiconductor light emitting device.

The side reflective structure may include a metallic material.

The side reflective structure may extend from an upper surface of the protective layer to a lower surface of the protective layer.

The display device may further include a lower reflective structure disposed between each of the plurality of micro-semiconductor light emitting devices and the driving substrate.

The lower reflective structure may include a reflective metal layer and an insulating layer disposed on the reflective metal layer.

Each of the plurality of micro-semiconductor light emitting devices may include a first electrode and a second electrode disposed on a surface.

The reflective metal layer may include a first reflective metal layer electrically connected to the first electrode of each of the plurality of micro-semiconductor light emitting devices and a second reflective metal layer electrically connected to the second electrode of each of the plurality of micro-semiconductor light emitting devices.

According to another aspect of an example embodiment, there is provided a display device including a driving substrate, a barrier layer disposed on an upper surface of the driving substrate and including a plurality of recesses, the barrier layer having a flexible polymer material, a micro-semiconductor light emitting device disposed in each of the plurality of recesses, and a side reflective structure included in the barrier layer and provided adjacent to a sidewall of each of the plurality of recesses.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
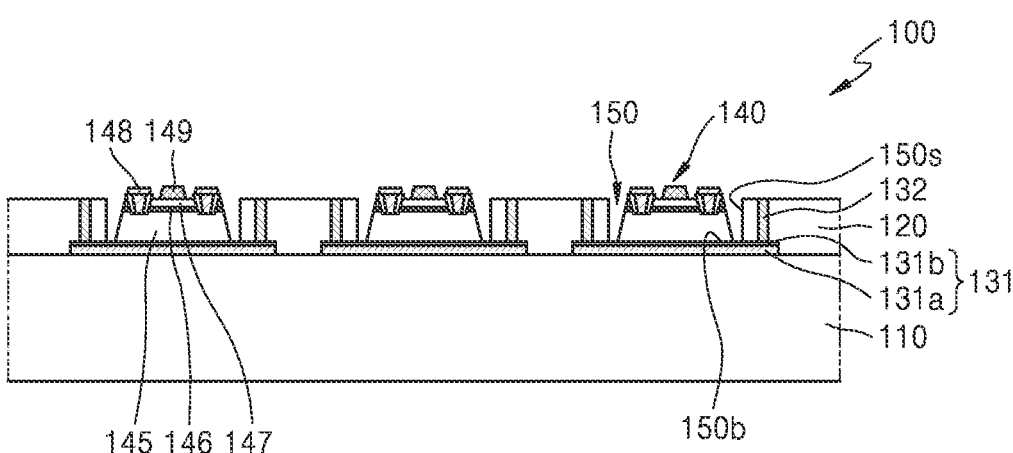
FIG. 1 is a cross-sectional view schematically illustrating a structure of a display device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a display device including a reflective structure will be described in detail with reference to the accompanying drawings. Like reference numerals in the drawings denote like elements, and, in the drawings, the sizes of elements may be exaggerated for clarity and for convenience of explanation. The example embodiments described hereinafter are merely examples, and various modifications may be made from these embodiments.

Hereinafter, when it is described that a certain component is "above" or "on" another component, the certain component may be directly above another component, or a third component may be interposed therebetween. An expression in the singular includes an expression in the plural unless they are clearly different from each other in context. In addition, when a certain part "includes" a certain component, this indicates that the part may further include another component instead of excluding another component unless there is different disclosure.

The use of the term "the" and similar referential terms may refer to both the singular and the plural. The steps of methods described herein may be performed in any suitable order unless otherwise indicated herein or otherwise clearly contradicted by context, and embodiments of the present disclosure are not limited to the described order of the operations.

In addition, the term, such as " . . . unit" or "module," disclosed in the specification indicates a unit for processing at least one function or operation, and this may be implemented by hardware, software, or a combination thereof.

The connections or connecting members of lines between the components shown in the drawings represent functional connections and/or physical or circuit connections, which may be represented as various replaceable or additional functional connections, physical connections or circuit connections in actual devices.

The use of any and all examples, or exemplary language provided herein, is intended merely to better illuminate the inventive concept and does not pose a limitation on the scope of the inventive concept unless otherwise claimed.

FIG. 1 is a cross-sectional view schematically illustrating a structure of a display device 100 according to an example embodiment. Referring to FIG. 1, the display device 100 may include a driving substrate 110 having a driving circuit, etc., a barrier layer 120 disposed on an upper surface of the driving substrate 110 and having a plurality of recesses 150, a micro-semiconductor light emitting device 140 disposed in each of the recesses 150, and a side reflective structure 132 disposed inside the barrier layer 120 to be provided adjacent to and surround a sidewall of each of the recesses 150.

The micro-semiconductor light emitting device 140 may include various types of light emitting devices having a micro-scale size. For example, a width, diameter, or thickness of the micro-semiconductor light emitting device 140 may be about 1000 μm or less, or about 200 μm or less, or about 100 μm or less, or about 50 μm or less. The micro-semiconductor light emitting device 140 may include a semiconductor light emitting device such as a light emitting diode (LED) or a vertical-cavity surface-emitting laser (VC-SEL).

The micro-semiconductor light emitting device 140 may include a first semiconductor layer 145, an active layer 146, and a second semiconductor layer 147. The first semiconductor layer 145 and the second semiconductor layer 147 may be electrically doped opposite types. For example, the first semiconductor layer 145 may be doped n-type and the second semiconductor layer 147 may be doped p-type, or the first semiconductor layer 145 may be doped p-type and the second semiconductor layer 147 may be doped n-type. The active layer 146 may have, for example, a quantum well structure or a multi-quantum well structure.

In addition, the micro-semiconductor light emitting device 140 may include a first electrode 148 and a second electrode 149 disposed on the same surface. The first electrode 148 may be electrically connected to the first semiconductor layer 145, and the second electrode 149 may be electrically connected to the second semiconductor layer 147. The first electrode 148 and the second electrode 148 may be arranged to be symmetrical with respect to a central axis of the micro-semiconductor light emitting device 140 so that relative positions of the first electrode 148 and the second electrode 149 may be fixed even if the micro-semiconductor light emitting device 140 rotates around the central axis in the recess 150. For example, the second electrode 149 may be disposed in a central portion of an upper surface of the micro-semiconductor light emitting device 140, and the first electrode 148 may be disposed in a peripheral portion of the upper surface. The shape of the micro-semiconductor light emitting device 140 described above is an example and not limited thereto.

A driving circuit including a thin film transistor (TFT) for driving the micro-semiconductor light emitting device 140 may be disposed in the driving substrate 110. In addition, the display device 100 may further include via holes and wirings arranged to electrically connect the first electrode 148 and the second electrode 149 of the micro-semiconductor light emitting device 140 to the driving circuit in the driving substrate 110.

The barrier layer 120 including the recesses 150 is provided on the driving substrate 110 to arrange the micro-semiconductor light emitting devices 140 in accurate positions on the upper surface of the driving substrate 110. The micro-semiconductor light emitting device 140 may be seated in each of the recesses 150 using a fluidic self-assembly method, which will be described later. By guiding the micro-semiconductor light emitting devices 140 into the recesses 150 of the barrier layer 120, the micro-semiconductor light emitting devices 140 may be two-dimensionally aligned in accurate positions on the driving substrate 110.

The recess 150 may have an area larger than an area of the micro-semiconductor light emitting device 140 to accommodate the micro-semiconductor light emitting device 140. For example, the area of the recess 150 may be greater than the area of the micro-semiconductor light emitting device 140 and smaller than twice the area of the micro-semiconductor light emitting device 140. Then, one micro-semiconductor light emitting device 140 may be disposed in one recess 150. Also, a height of the recess 150 may be similar to a thickness of the micro-semiconductor light emitting device 140. For example, the height of the recess 150 may be 0.8 times or more and 1.5 times or less the thickness of the micro-semiconductor light emitting device 140. The recess 150 may have a shape similar to that of the micro-semiconductor light emitting device 140, for example, a polygonal or circular shape.

A bottom surface 150b of the recess 150 may have hydrophilicity so that the upper surface of the micro-semiconductor light emitting device 140 in which the first electrode 148 and the second electrode 149 are disposed faces the outside of the recess 150 when the micro-semiconductor light emitting device 140 is seated in the recess 150 through the fluidic self-assembly method. In particular, the bottom surface 150b of the recess 150 that comes into contact with a lower surface of the micro-semiconductor light emitting device 140 may include a dielectric material having a smooth surface to have high hydrophilicity. For example, a root mean square (RMS) roughness of the bottom surface 150b of the recess 150 may be about 50 nm or less or about 10 nm or less. In addition, the lower surface of the micro-semiconductor light emitting device 140 in contact with the bottom surface 150b of the recess 150 may also have hydrophilicity and may have an RMS roughness of about 50 nm or less or about 10 nm or less. Then, the micro-semiconductor light emitting device 140 may be guided such that the hydrophilic lower surface faces the bottom surface 150b of the hydrophilic recess 150.

The barrier layer 120 may include a flexible polymer material. For example, the barrier layer 120 may include at least one of an acrylic polymer, a silicone-based polymer, or an epoxy-based polymer. In addition, the barrier layer 120 may further include a photosensitive material. When the barrier layer 120 includes a photosensitive material, the recesses 150 may be formed by a photolithography method. When the barrier layer 120 does not include a photosensitive material, the recesses 150 may be formed by etching and molding. Because the barrier layer 120 includes a flexible material, even if a slight pressure is applied to the barrier layer 120 to align the micro-semiconductor light emitting device 140 in the recess 150, the barrier layer 120 may be restored to its original state. In addition, because the polymer material may be formed with a constant thickness in a large area through a general coating process, it is possible to form the barrier layer 120 on the large area driving substrate 110.

The micro-semiconductor light emitting device 140 disposed in each recess 150 may serve as a pixel of the display device 100. The side reflective structure 132 may be disposed to reflect light emitted in a lateral direction of each micro-semiconductor light emitting device 140 in order to prevent or reduce crosstalk between adjacent pixels. To this end, the side reflective structure 132 may be disposed to surround a side surface of each micro-semiconductor light emitting device 140 and block light from being transmitted. For example, the side reflective structure 132 may be disposed inside the barrier layer 120 to surround a sidewall 150s of each recess 150. In FIG. 1, it is illustrated that the side reflective structure 132 completely penetrates through the barrier layer 120 and extends from an upper surface to a lower surface of the barrier layer 120 in a vertical direction, but embodiments are not limited thereto. For example, the side reflective structure 132 may not penetrate through the barrier layer 120 so that the lower surface of the side reflective structure 132 is surrounded by a lower portion of the barrier layer 120. In addition, the side reflective structure 132 may be embedded in the barrier layer 120 so that the upper surface of the side reflective structure 132 is surrounded by an upper portion of the barrier layer 120.

The side reflective structure 132 may include a metallic material such as aluminum (Al) or silver (Ag) that has excellent reflectivity with respect to light emitted from the micro-semiconductor light emitting device 140 and rarely transmits light emitted from the micro-semiconductor light emitting device 140. Because such a metallic material is generally hydrophobic, the side reflective structure 132 is disposed not to directly contact the bottom surface 150b of the recess 150. If the hydrophilic bottom surface 150b of the recess 150 is in contact with the side reflective structure 132, surface energy of the bottom surface 150b may change and surface roughness may increase to hinder the lower surface of the micro-semiconductor light emitting device 140 having hydrophilicity from being disposed to face the bottom surface 150b of the recess 150 having hydrophilicity. For example, the side reflective structure 132 may be disposed in the barrier layer 120 so that the sidewall 150s of the recess 150 is disposed between the micro-semiconductor light emitting device 140 and the side reflective structure 132.

The display device 100 may further include a lower reflective structure 131 adjacent to a bottom side of each recess 150. The lower reflective structure 131 may reflect light emitted in a downward direction of the micro-semiconductor light emitting device 140 to improve light utilization efficiency. Therefore, the use of the lower reflective structure 131 may increase brightness of the display device 100 and reduce power consumption.

An upper surface of the lower reflective structure 131 may be the bottom surface 150b of the recess 150. As described above, the bottom surface 150b of the recess 150 has hydrophilicity. Thus, the lower reflective structure 131 may be configured to have a hydrophilic surface. To this end, the lower reflective structure 131 may include a reflective metal layer 131a disposed on an upper surface of the driving substrate 110 and an insulating layer 131b disposed to cover the reflective metal layer 131a and having a hydrophilic surface. For example, the insulating layer 131b may include a dielectric material transparent to visible light, and an upper surface of the insulating layer 131b may have an RMS roughness of about 50 nm or less or 10 nm or less. In addition, the reflective metal layer 131a may include at least one of aluminum (Al) and silver (Ag).

In order to increase light utilization efficiency, the lower reflective structure 131 may have an area larger than that of the recess 150. Accordingly, the lower reflective structure 131 may partially overlap the barrier layer 120. For example, a portion of the barrier layer 120 may be disposed on a portion of the upper surface of the lower reflective structure 131. Also, the lower reflective structure 131 may extend laterally so that a portion of the upper surface of the lower reflective structure 131 contacts a lower surface of the side reflective structure 132. In this case, the side reflective structure 132 may extend from the upper surface of the barrier layer 120 to the upper surface of the lower reflective structure 131, in particular, to the upper surface of the insulating layer 131b, by passing through the inside of the barrier layer 120 in a vertical direction.

Figure 2:
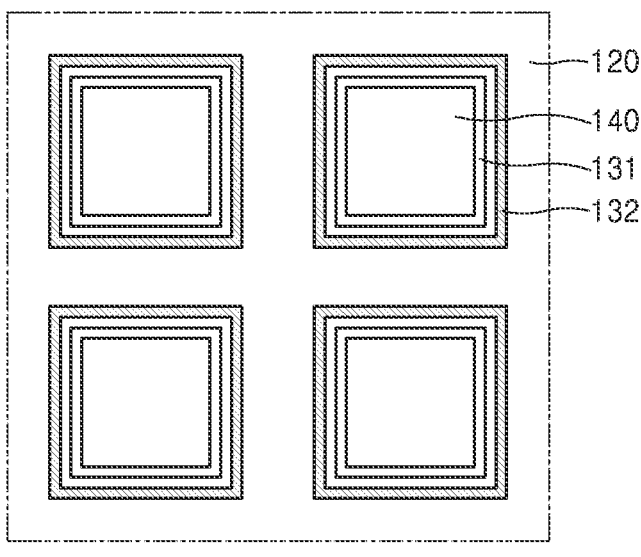
FIG. 2 is a plan view schematically illustrating a structure of a display device according to an example embodiment.

FIG. 2 is a plan view schematically illustrating a structure of the display device 100 according to an example embodiment. Referring to FIG. 2, the micro-semiconductor light emitting devices 140 may be respectively disposed in the two-dimensionally arranged recesses 150. Accordingly, the display device 100 may include the micro-semiconductor light emitting devices 140 arranged in two dimensions. A shape of the recess 150 may be the same as that of the micro-semiconductor light emitting device 140, and an area of the recess 150 is larger than an area of the micro-semiconductor light emitting device 140. Accordingly, a gap may exist between the sidewall 150s of the recess 150 and a side surface of the micro-semiconductor light emitting device 140. The side reflective structure 132 may surround the sidewall 150s of the recess 150 and may have an internal surface having the same shape as that of the recess 150 and the micro-semiconductor light emitting device 140. In FIG. 2, the internal surfaces of the recess 150, the micro-semiconductor light emitting device 140, and the side reflective structure 132 are illustrated as having a quadrangular shape, but embodiments are not limited thereto. For example, the internal surfaces of the recess 150, the micro-semiconductor light emitting device 140, and the side reflective structure 132 may have a circular shape. Because the side reflective structure 132 is disposed on an outer side of the sidewall 150s of the recess 150, a total length of the internal surface of the side reflective structure 132 is greater than a length of the sidewall 150s of the recess 150.

Figure 3:
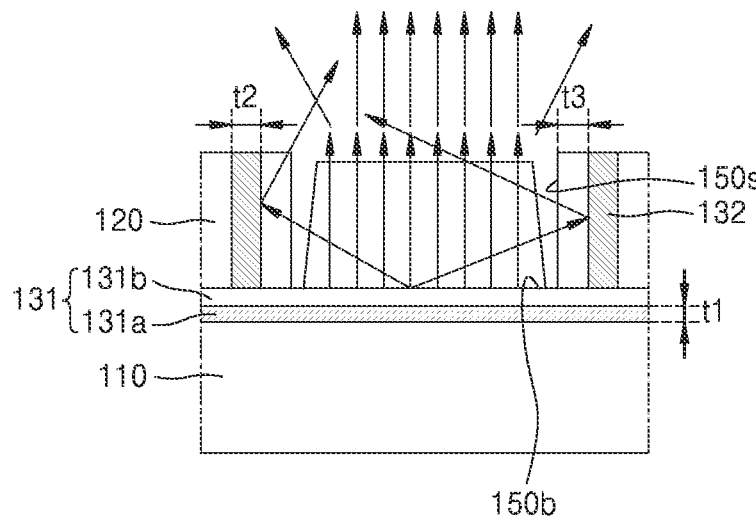
FIG. 3 is a cross-sectional view illustrating an arrangement of a side reflective structure and a lower reflective structure for one micro-semiconductor light emitting device in the display device illustrated in FIG. 1.

FIG. 3 is a cross-sectional view illustrating an arrangement of the side reflective structure 132 and the lower reflective structure 131 with respect to one micro-semiconductor light emitting device in the display device 100 illustrated in FIG. 1. Referring to FIG. 3, because light emitted in a lateral direction of the micro-semiconductor light emitting device 140 is reflected by the side reflective structure 132, crosstalk between adjacent pixels of the display device 100 may be prevented or reduced. In addition, because a portion of the light reflected by the side reflective structure 132 may contribute to image formation, light utilization efficiency of the display device 100 may also increase. Because light emitted in the downward direction of the micro-semiconductor light emitting device 140 is reflected in an upward direction by the lower reflective structure 131 to contribute to image formation, the light utilization efficiency of the display device 100 may further increase.

The side reflective structure 132 is disposed inside the barrier layer 120 so that the bottom surface 150b of the hydrophilic recess 150 is not covered by the side reflective structure 132. For example, the side reflective structure 132 may be disposed inside the barrier layer 120 such that the sidewall 150s of the recess 150 is disposed between the micro-semiconductor light emitting device 140 and the side reflective structure 132. If the side reflective structure 132 is too far from the sidewall 150s of the recess 150, light may be absorbed by the barrier layer 120 to increase light loss, and if the side reflective structure 132 is too close to the sidewall 150s of the recess 150, the possibility of damage to the sidewall 150s may increase. Considering this, a horizontal distance t3 from the sidewall 150s of the recess 150 to the side reflective structure 132 may be within a range of about 0.1 μm to about 50 μm. Here, a horizontal direction is a direction parallel to the upper surface of the driving substrate 110.

A width t2 of the side reflective structure 132 in a direction parallel to the upper surface of the driving substrate 110 may be determined to be within a range from about 1 □m to a value smaller than a width of the micro-semiconductor light emitting device 140 in the horizontal direction, considering reflectivity of the side reflective structure 132 and an overall structure and size of the display device 100. The thickness t1 of the reflective metal layer 131a of the lower reflective structure 131 in the normal direction of the upper surface of the driving substrate 110 may also be within a range of about 50 nm to about 1 μm.

FIGS. 4A to 4D are cross-sectional views illustrating a method of manufacturing the display device 100 illustrated in FIG. 1.

Figure 4A:
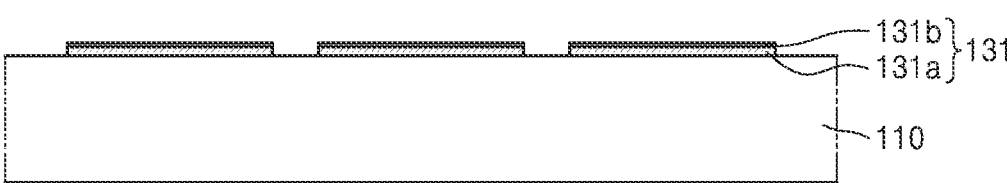
FIGS. 4A, 4B, 4C, and 4D are cross-sectional views illustrating a method of manufacturing the display device illustrated in FIG. 1.

First, referring to FIG. 4A, the lower reflective structures 131 may be formed on the driving substrate 110 in a position in which the micro-semiconductor light emitting device 140 is to be disposed. For example, after sequentially depositing a metallic material of the reflective metal layer 131a and a dielectric material of the insulating layer 131b over the entire area of the upper surface of the driving substrate 110, the metallic material of the reflective metal layer 131a and the insulating layer 131b may be patterned to form the lower reflective structures 131.

Figure 4B:
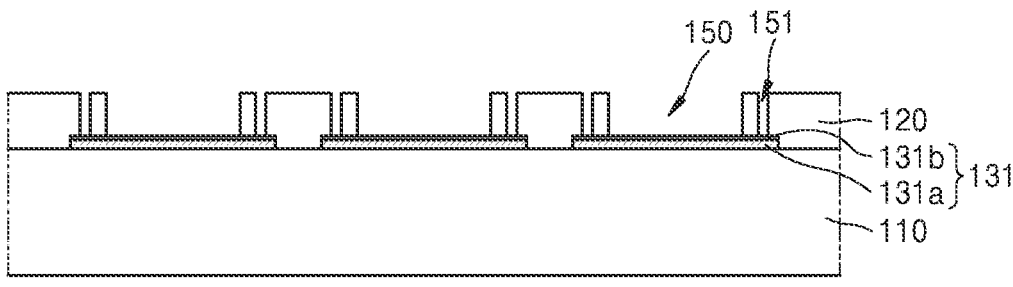

Referring to FIG. 4B, the barrier layer 120 may be formed on the upper surface of the driving substrate 110. The barrier layer 120 may be formed by stacking a polymer material including a photosensitive material over the entire area of the upper surface of the driving substrate 110. Thereafter, the recesses 150 may be formed in positions in which the micro-semiconductor light emitting devices 140 are to be disposed by exposing and patterning the barrier layer 120 using photolithography. Each of the recesses 150 may be formed to penetrate through the barrier layer 120 to expose the lower reflective structure 131. In addition, while forming the recess 150, a trench 151 surrounding the periphery of the recess 150 may be formed together. The trench 151 may be formed to completely penetrate through the barrier layer 120 to expose the lower reflective structure 131, but is not limited thereto. For example, the trench 151 may extend only to the lower portion of the barrier layer 120, instead of completely penetrating through the barrier layer 120. It is also possible to form the barrier layer 120 having the recess 150 and the trench 151 using an etching method or a molding method, instead of the photolithography.

Figure 4C:
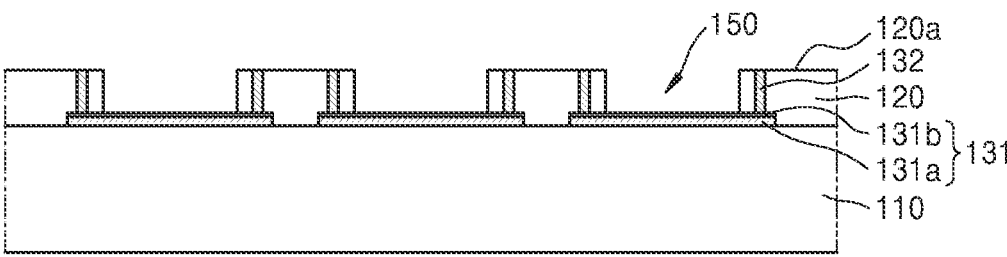

Referring to FIG. 4C, the side reflective structure 132 may be formed by filling the trench 151 with a reflective metallic material. Then, the metallic material having hydrophobicity is partially exposed from the upper surface 120a of the barrier layer 120. As a result, the upper surface 120a of the barrier layer 120 may have a hydrophobic surface with increased surface roughness.

Figure 5:
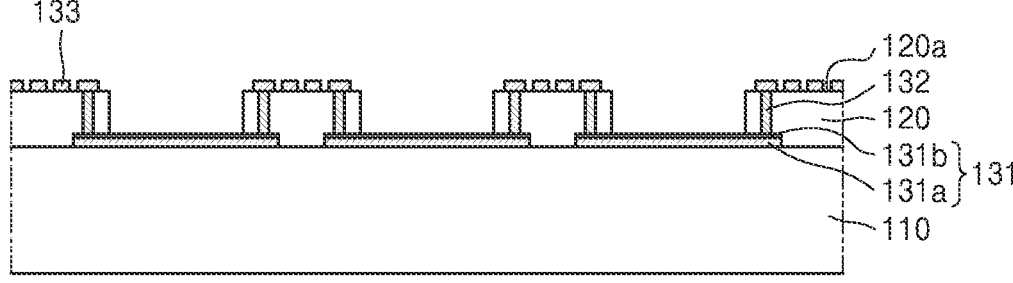
FIG. 5 is a cross-sectional view schematically illustrating a structure of a barrier layer in which an upper surface of the barrier layer is treated to have hydrophobicity.

In order for the upper surface 120a of the barrier layer 120 to have hydrophobicity with increased surface roughness, a pattern including the same metallic material as that of the side reflective structure 132 may be further formed on the upper surface 120a of the barrier layer 120. For example, FIG. 5 is a cross-sectional view schematically illustrating a structure of the barrier layer 120 in which the upper surface of the barrier layer 120 is treated to have increased hydrophobicity. Referring to FIG. 5, a hydrophobic pattern 133 for increasing surface roughness may be formed on the upper surface 120a of the barrier layer 120. The hydrophobic pattern 133 may be formed together when the side reflective structure 132 is formed in the trench 151, and may include the same material as that of the side reflective structure 132.

Figure 4D:
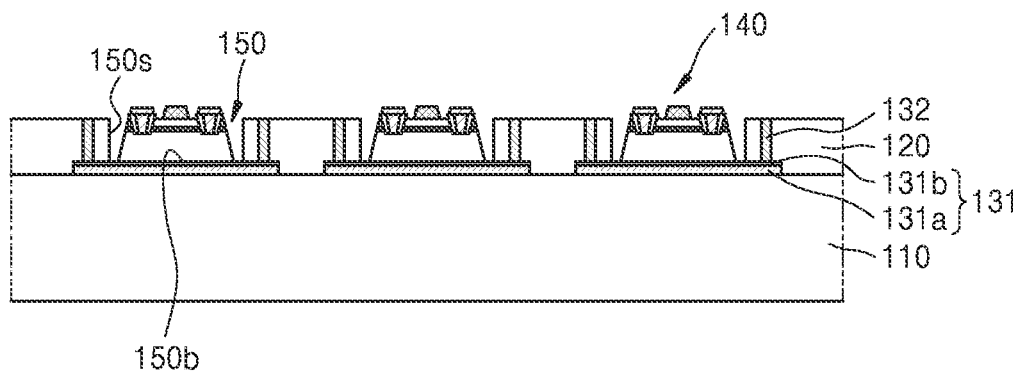

Referring to FIG. 4D, the micro-semiconductor light emitting device 140 may be seated in the recess 150 using a fluidic self-assembly method. For example, a liquid and the micro-semiconductor light emitting device 140 may be supplied on the barrier layer 120, and the barrier layer 120 may be scanned with an absorber capable of absorbing the liquid. After the absorber scans over the barrier layer 120, a remaining micro-semiconductor light emitting device 140 that does not enter the recess 150 may be removed. By repeating this process, the micro-semiconductor light emitting device 140 may be seated in all the recesses 150. Because the sidewall 150s and the bottom surface 150b of the recess 150 have hydrophilicity and the upper surface 120a of the barrier layer 120 has low hydrophilicity or hydrophobicity, the lower surface of the micro-semiconductor light emitting device 140 having hydrophilicity may be guided toward the inside of the recess 150 and the first and second electrodes 148 and 149 of the micro-semiconductor light emitting device 140 having hydrophobicity may be aligned toward the outside of the recess 150. Such a fluidic self-assembly method will be described in more detail later.

After transferring the micro-semiconductor light emitting device 140 into the recess 150, a process of forming an insulating layer covering the micro-semiconductor light emitting device 140 and the barrier layer 120, a process of forming a wiring electrically connected to the first and second electrodes 148 and 149 of the micro-semiconductor light emitting device 140 through the insulating layer, a process of forming a protective layer, and the like, may be further performed. This will be described in more detail later.

Figure 6:
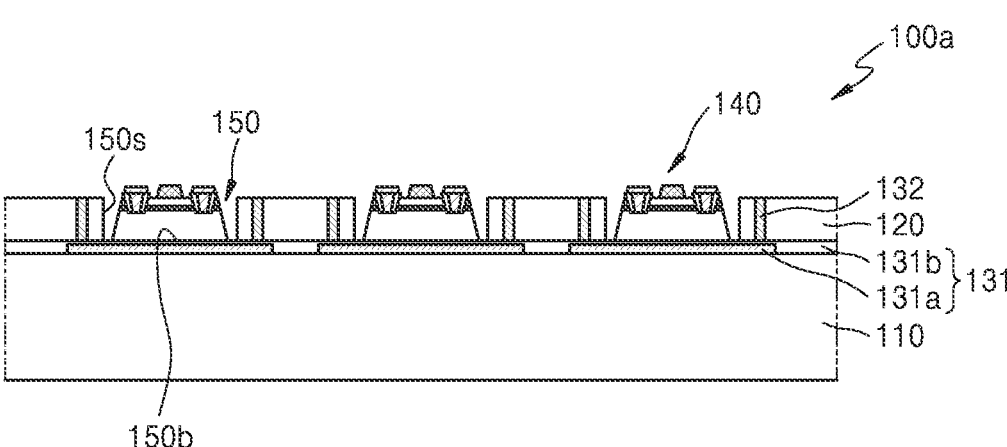
FIG. 6 is a cross-sectional view schematically illustrating a structure of a display device according to another example embodiment.

FIG. 6 is a cross-sectional view schematically illustrating a structure of the display device 100*a* according to another example embodiment. In FIGS. 1 and 4A to 4D, the display device 100 is illustrated as including separated lower reflective structures 131. In general, because an electrode pad for electrical connection with the micro-semiconductor light emitting device 140 is disposed on the upper surface of the driving substrate 110, the reflective metal layer 131*a* including a metallic material may not be formed over the entire area of the upper surface of the driving substrate 110 and the reflective metal layer 131*a* may be formed only under the micro-semiconductor light emitting device 140. It is not necessary for the insulating layers 131*b* to be individually disposed on the reflective metal layers 131*a*, respectively. Referring to FIG. 6, the lower reflective structure 131 of the display device 100*a* may include a plurality of reflective metal layers 131*a* respectively disposed in the recesses 150 to face the lower surface of the micro-semiconductor light emitting device 140 and one insulating layer 131*b* disposed on the upper surface of the driving substrate 110 to cover the reflective metal layers 131*a*.

FIGS. 7A to 7F are cross-sectional views illustrating a method of manufacturing a display device, illustrating a wiring between a driving substrate and a micro-semiconductor light emitting device.

Figure 7A:
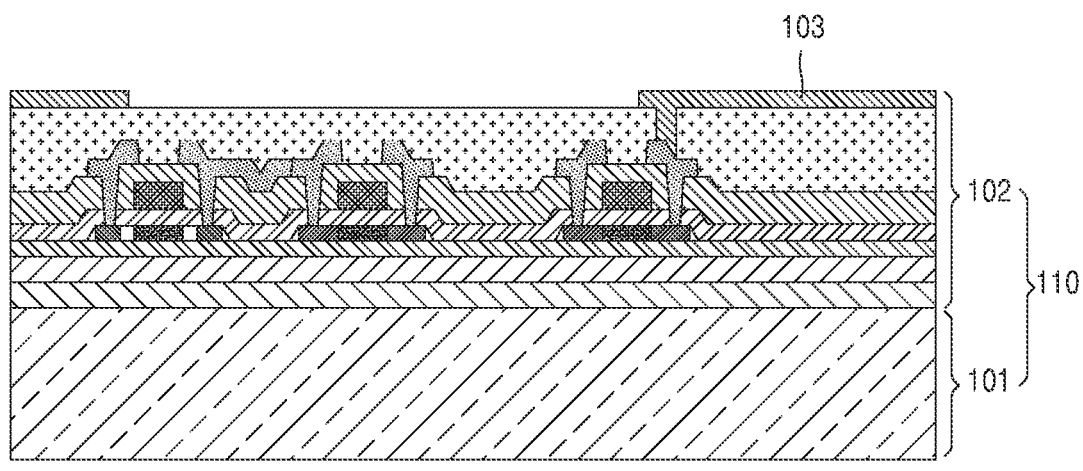
FIGS. 7A, 7B, 7C, 7D, 7E, and 7F are cross-sectional views illustrating a method of manufacturing a display device, illustrating wiring between a driving substrate and a micro-semiconductor light emitting device.

Referring to FIG. 7A, the driving substrate 110 including an insulating support substrate 101 and a driving circuit layer 102 disposed on the support substrate 101 is provided. The support substrate 101 may include, for example, glass or a polymer material. The driving circuit layer 102 may include a driving circuit including a TFT, a capacitor, or the like. A first electrode pad 103 electrically connected to source/drain electrodes of the TFT may be disposed on an upper surface of the driving circuit layer 102.

Figure 7B:
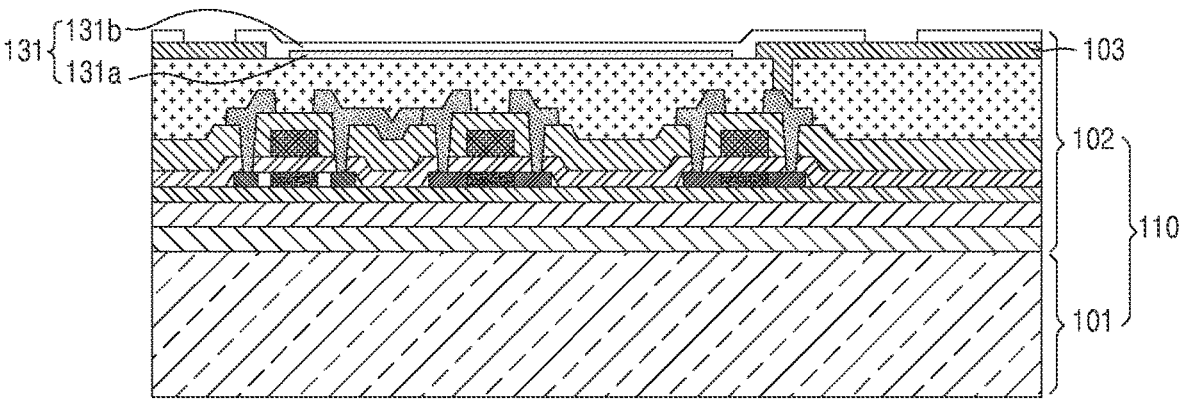

Referring to FIG. 7B, a reflective metal layer 131*a* may be formed on an upper surface of the driving circuit layer 102 so as not to contact the first electrode pad 103, and an insulating layer 131*b* may be formed to cover both the first electrode pad 103 and the reflective metal layer 131*a*. The reflective metal layer 131*a* and the insulating layer 131*b* form the lower reflective structure 131. According to another example embodiment, when the first electrode pad 103 and the reflective metal layer 131*a* include the same metallic material, the first electrode pad 103 and the reflective metal layer 131*a* may be simultaneously formed through one process. For example, after a metal layer is deposited on the upper surface of the driving circuit layer 102, the first electrode pad 103 and the reflective metal layer 131*a* may be formed together through patterning.

Figure 7C:
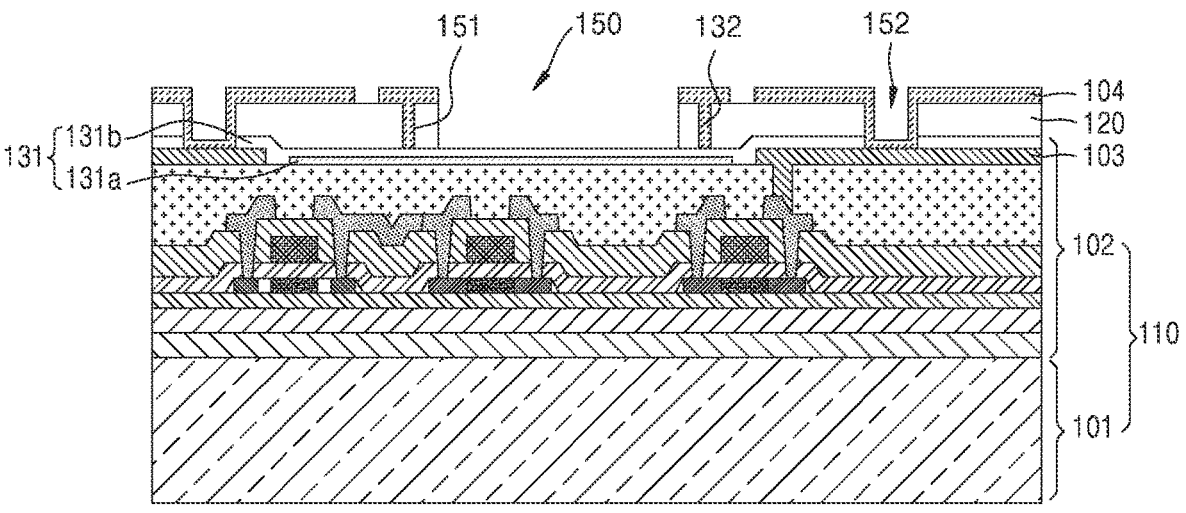

Referring to FIG. 7C, after the barrier layer 120 is formed on the upper surface of the driving circuit layer 102, the barrier layer 120 may be patterned to form the recesses 150 and the trench 151 surrounding the recesses 150. In addition, a via hole 152 penetrating through the barrier layer 120 may be further formed so that a portion of the first electrode pad 103 is exposed. The recess 150, the trench 151, and the via hole 152 may be formed together by patterning the barrier layer 120.

Thereafter, the side reflective structure 132 may be formed by filling the trench 151 with a metallic material, and a conductive metal layer 104 may be formed by filling the via hole 152 with a metallic material. The side reflective structure 132 and the conductive metal layer 104 may be simultaneously formed using a metallic material having conductivity and reflectivity, such as aluminum or silver. The conductive metal layer 104 may be electrically connected to the first electrode pad 103 through the via hole 152. In addition, the conductive metal layer 104 may extend in a horizontal direction on an upper surface of the barrier layer 120. The upper surface of the barrier layer 120 has hydrophobicity due to the conductive metal layer 104 extending on the upper surface of the barrier layer 120. A portion of the side reflective structure 132 may also extend on the upper surface of the barrier layer 120 in the horizontal direction.

Figure 7D:
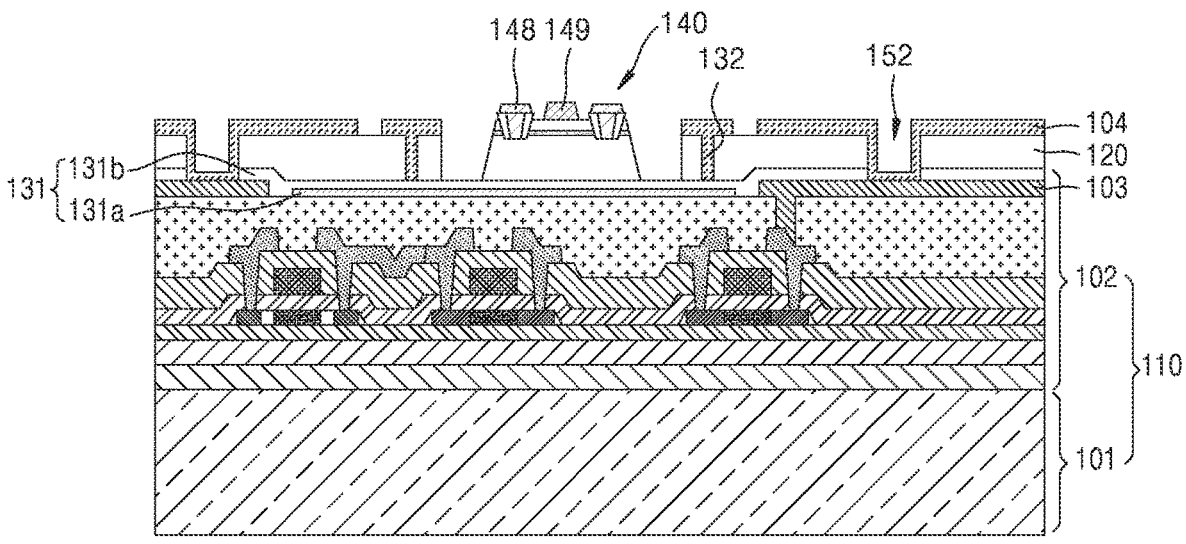

Referring to FIG. 7D, the micro-semiconductor light emitting device 140 may be seated in the recess 150 using a fluidic self-assembly method. The first and second electrodes 148 and 149 of the micro-semiconductor light emitting device 140 may be aligned toward the outside of the recess 150 through the fluidic self-assembly method.

Figure 7E:
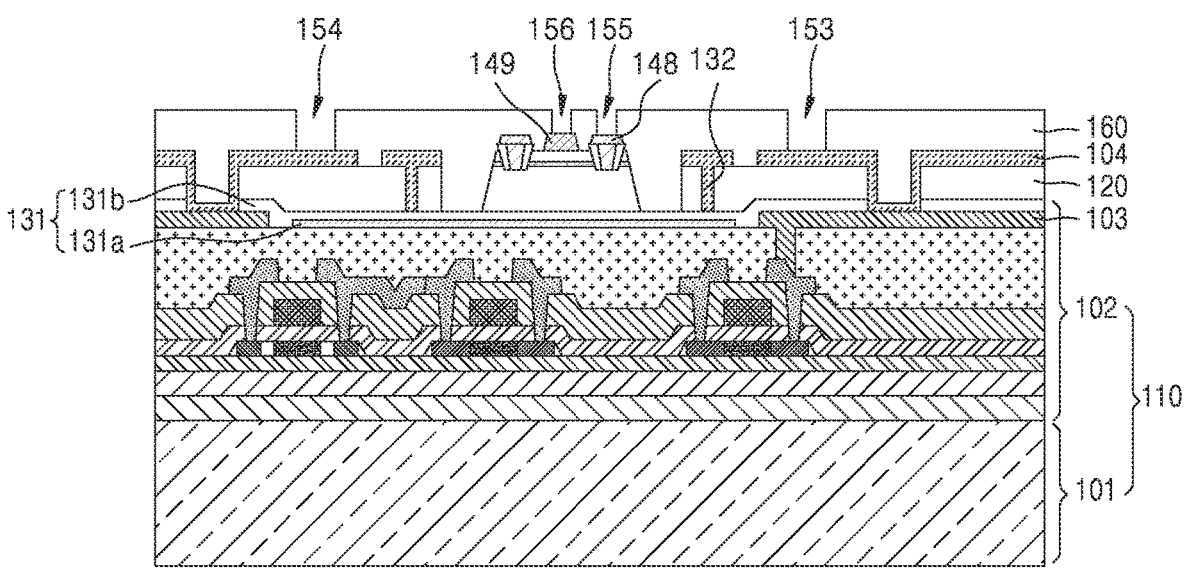

Referring to FIG. 7E, the insulating layer 160 may be formed to completely cover the micro-semiconductor light emitting device 140 and the barrier layer 120. The insulating layer 160 may include a dielectric material transparent to visible light. In addition, the insulating layer 160 may be patterned to form a plurality of via holes 153, 154, 155, and 156 penetrating through the insulating layer 160 in a vertical direction. The via holes 153 and 154 may expose the conductive metal layer 104 through the insulating layer 160, and the via holes 155 and 156 may expose the first and second electrodes 148 and 159 of the micro-semiconductor light emitting device 140 through the insulating layer 160.

Figure 7F:
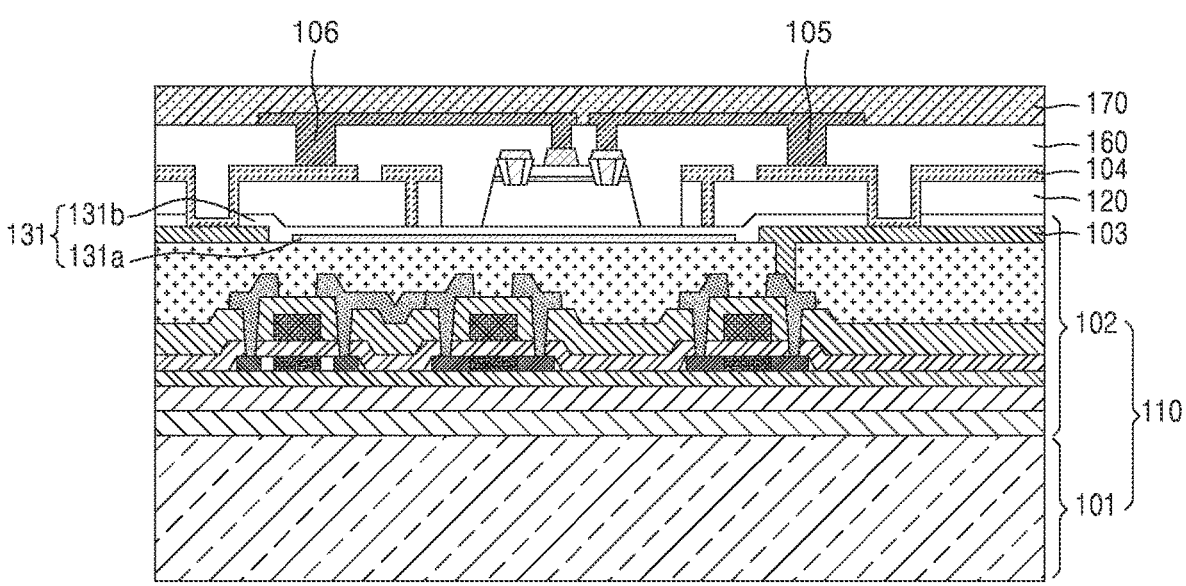

Referring to FIG. 7F, the via holes 153, 154, 155, and 156 may be filled with a conductive metallic material to form wirings 105 and 106 electrically connecting the first and second electrodes 148 and 149 to the source/drain electrodes of the TFT in the driving circuit layer 102. In addition, a transparent protective layer 170 covering the insulating layer 160 and the wirings 105 and 106 may be further formed.

Figure 8:
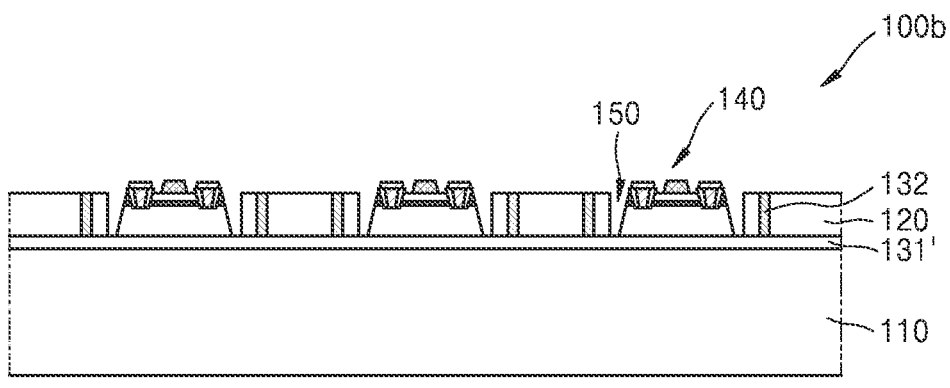
FIG. 8 is a cross-sectional view schematically illustrating a structure of a display device according to another example embodiment.

FIG. 8 is a cross-sectional view schematically illustrating a structure of a display device 100*b* according to another example embodiment. Referring to FIG. 8, the display device 100*b* may include a lower reflective structure 131' including only an insulating dielectric material. Because the lower reflective structure 131' does not include a metallic material, it may be disposed on the entire area of the upper surface of the driving substrate 110. The rest of the configuration of the display device 100*b* is the same as the configuration of the display devices 100 and 100*a* described above, and thus a description thereof is omitted.

Figure 9:
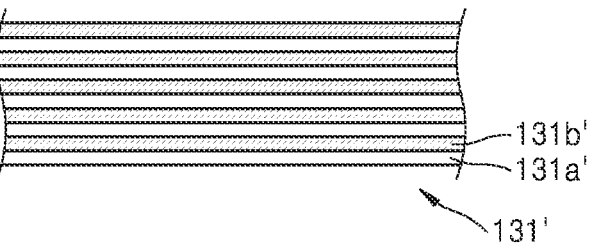
FIG. 9 is a cross-sectional view illustrating a layer structure of a lower reflective structure illustrated in FIG. 8.

FIG. 9 is a cross-sectional view illustrating a layer structure of the lower reflective structure 131' illustrated in FIG. 8. Referring to FIG. 9, the lower reflective structure 131' may include a first dielectric layer 131*a'* and a second dielectric layer 131*b'* being repeatedly and alternately stacked. The first dielectric layer 131*a'* may have a first refractive index, and the second dielectric layer 131*b'* may have a second refractive index different from the first refractive index. In this case, a high reflectivity may be obtained by matching phases of light reflected from interfaces between the first dielectric layer 131*a'* and the second dielectric layer 131*b'*. Thus, the lower reflective structure 131' may be a distributed Bragg reflector. The reflectivity of the lower reflective structure 131' may increase as the number of stacking of the first dielectric layer 131*a'* and the second dielectric layer 131*b'* increases. Considering an overall structure and size of the display device 100*b*, a thickness of the lower reflective structure 131' in the normal direction of the upper surface of the driving substrate 110 may be set within a range of about 500 nm to about 2 μm.

Figure 10:
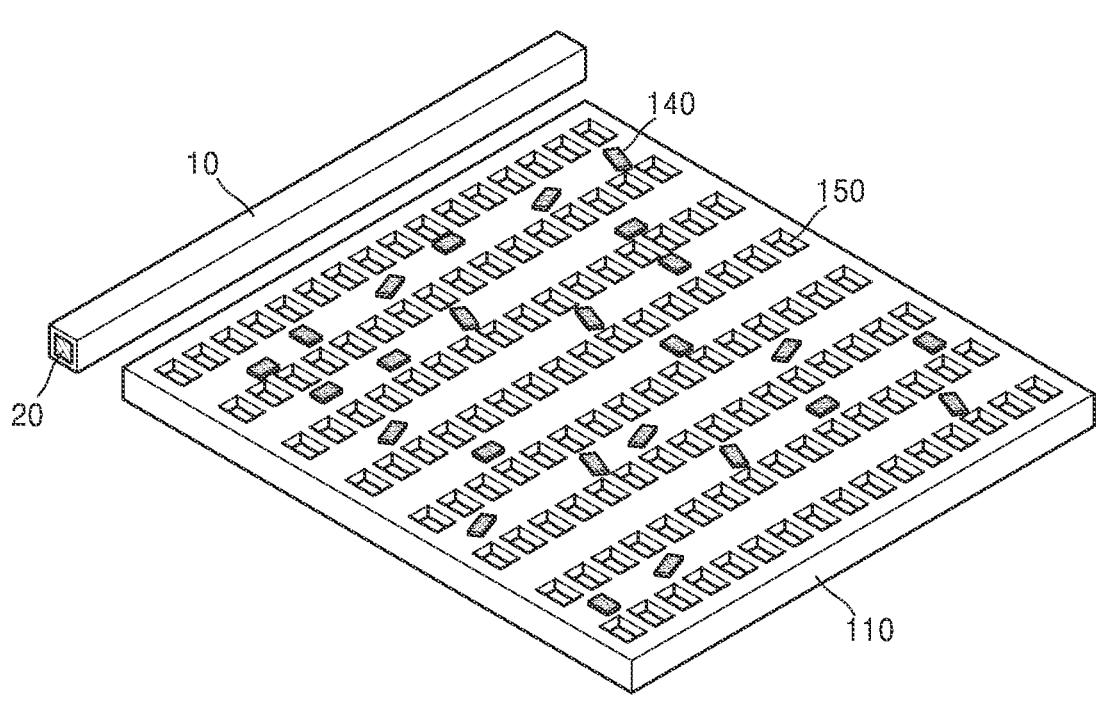
FIG. 10 is a perspective view illustrating a method of aligning a micro-semiconductor light emitting device using a fluidic self-assembly method.

FIG. 10 is a perspective view illustrating a method of aligning a micro-semiconductor light emitting device 140 using a fluidic self-assembly method. Referring to FIG. 10, the micro-semiconductor light emitting devices 140 may be provided on the upper surface of the driving substrate 110 having the two-dimensionally arranged recesses 150. The micro-semiconductor light emitting devices 140 may be directly scattered onto the driving substrate 110 after a liquid is supplied to the recesses 150 of the driving substrate 110 or may be included in a suspension and supplied to the driving substrate 110.

The liquid supplied to the recess 150 may be any kind of liquid as long as it does not corrode or damage the micro-semiconductor light emitting device 140 and may be supplied to the recess 150 by various methods such as a spray method, a dispensing method, an inkjet dot method, or a method of allowing a liquid to flow to the driving substrate 110. The liquid may include, for example, one of a plurality of groups consisting of water, ethanol, alcohol, polyol, ketone, halocarbon, acetone, flux, and an organic solvent or a combination thereof. The organic solvent may include, for example, isopropyl alcohol (IPA). The amount of supplied liquid may be adjusted to vary such that the liquid fits the recess 150 or overflows from the recess 150.

The micro-semiconductor light emitting devices 140 may be directly scattered onto the driving substrate 110 without another liquid or may be included in a suspension and supplied onto the driving substrate 110. As a method of supplying the micro-semiconductor light emitting device 140 included in the suspension, various methods such as a spray method, a dispensing method for dropping a liquid in drops, an inkjet dot method for discharging a liquid like a printing method, a method for allowing the suspension to flow to the driving substrate 110, and the like may be used.

Figure 11:
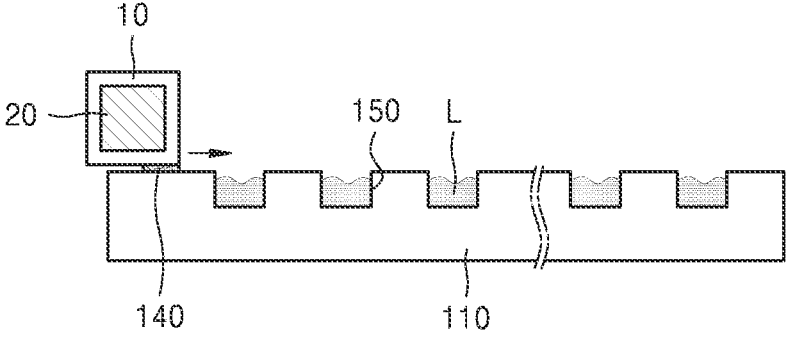
FIG. 11 schematically illustrates a scanning process for aligning a micro-semiconductor light emitting device.

FIG. 11 schematically illustrates a scanning process for aligning a micro-semiconductor light emitting device. Referring to FIG. 11, an absorber 10 may scan the driving substrate 110. As the absorber 10 in contact with the driving substrate 110 passes on the plurality of recesses 150 according to scanning, the micro-semiconductor light emitting device 140 may be moved into the recess 150 and may also absorb a liquid L present in the recess 150. The absorber 10 may be any material as long as the material is capable of absorbing the liquid L and a shape or structure thereof is not limited. The absorber 10 may include, for example, fabric, tissue, polyester fiber, paper, or a wiper.

The absorber 10 may be used alone without other auxiliary devices, but is not limited thereto, and may be coupled to a support 20 for facilitating scanning of the driving substrate 110. The support 20 may have various shapes and structures suitable for scanning the driving substrate 110. For example, the support 20 may have a shape of a rod, a blade, a plate, a wiper, or the like. The absorber 10 may be provided on any one side of the support 20 or may wrap around the support 20. The shapes of the support 20 and the absorber 10 are not limited to the illustrated quadrangular cross-sectional shape and may have a circular cross-sectional shape.

The absorber 10 may scan the driving substrate 110, while pressing the driving substrate 110 with an appropriate pressure. Because the barrier layer 120 of the driving substrate 110 includes a flexible polymer material, even if pressure is applied to the driving substrate 110, the driving substrate 110 may be restored to an original thickness thereof. Scanning may be performed according to various methods, for example, a sliding method, a rotating method, a translation method, a reciprocating method, a rolling method, a spinning method, and/or a rubbing method of the absorber 10, which may include both a regular method or an irregular method. Scanning may be performed by moving the driving substrate 110 instead of moving the absorber 10, and scanning of the driving substrate 110 may also be performed in a manner such as sliding, rotation, translational reciprocation, rolling, spinning, and/or rubbing. In addition, scanning may also be performed by cooperation between the absorber 10 and the driving substrate 110.

The supplying of the liquid L to the recess 150 of the driving substrate 110 and the supplying of the micro-semiconductor light emitting device 140 to the driving substrate 110 may be performed in a reverse order of the order described above. In addition, the supplying of the liquid L to the recess 150 of the driving substrate 110 and the supplying of the micro-semiconductor light emitting device 140 to the driving substrate 110 may be simultaneously performed in one step. For example, by supplying a suspension containing the micro-semiconductor light emitting device 140 to the driving substrate 110, the liquid L and the micro-semiconductor light emitting device 140 may be simultaneously supplied to the driving substrate 110.

After the absorber 10 scans the driving substrate 110, the micro-semiconductor light emitting device 140 remaining in the driving substrate 110 without entering the recess 150 may be removed. In addition, the processes described above may be repeated until the micro-semiconductor light emitting devices 140 are seated in all the recesses 150.

As described above, the display device according to the example embodiments may be manufactured in a large area using a fluidic self-assembly method. In addition, because the display device according to the example embodiments may include the side reflective structure in the barrier layer 120 for aligning the micro-semiconductor light emitting device 140, crosstalk between adjacent pixels may be reduced or prevented, and because the lower reflective structure 131 is provided at the bottom of the recess 150 in which the micro-semiconductor light emitting device 140 is seated, light efficiency may be improved.

In the above description, it is described that the shape of the recess 150 is similar to the shape of the micro-semiconductor light emitting device 140, but embodiments are not limited thereto. In particular, in order to align the micro-semiconductor light emitting devices 140 to accurate positions with little deviation, the shape of the recess 150 may be designed to be different from that of the micro-semiconductor light emitting device 140. For example, FIG. 12 is a perspective view illustrating an example of a shape of recesses provided in the barrier layer of the display device, and FIG. 13 is a plan view illustrating the shape of the recesses illustrated in FIG. 12.

Figure 12:
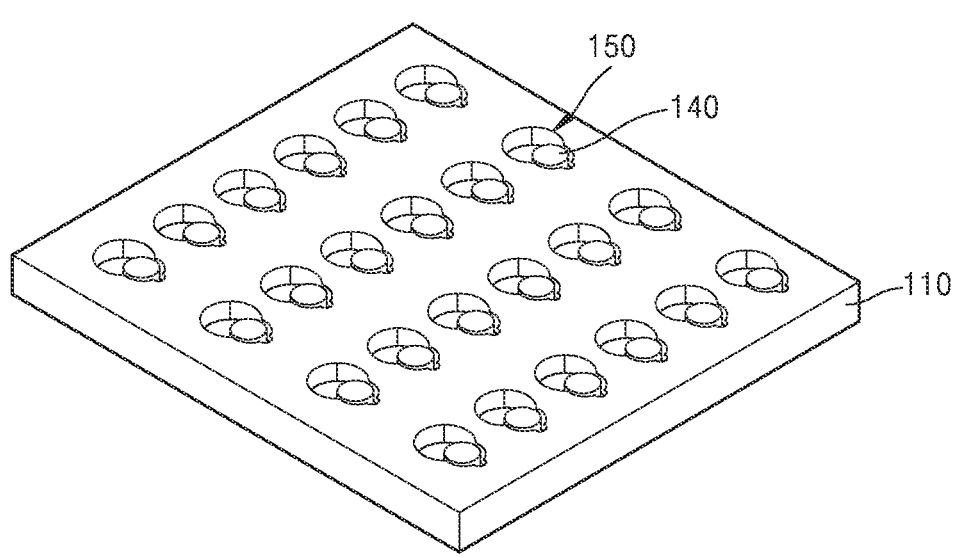
FIG. 12 is a perspective view illustrating a shape of recesses provided in a barrier layer of a display device.
Figure 13:
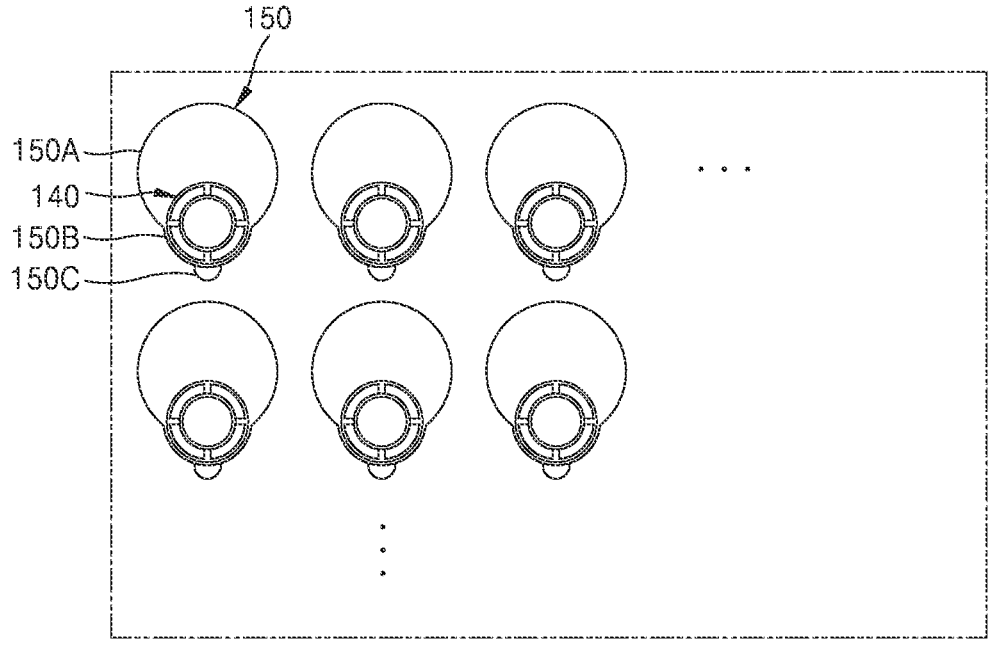
FIG. 13 is a plan view illustrating a shape of the recesses illustrated in FIG. 12.

Referring to FIGS. 12 and 13, each recess 150 includes a first trap 150A having a space in which the micro-semiconductor light emitting device 140 may move in the recess 150 and a second trap 150B which is connected to the first trap 150A and has a shape and size in which the micro-semiconductor light emitting device 140 may be seated. The recess 150 may also further include a third trap 150C connected to the second trap 150B and having a size smaller than the second trap 150B. The third trap 150C may serve as an impurity space. When the micro-semiconductor light emitting device 140 is aligned in the second trap 150B, impurities that may be present in a suspension including the micro-semiconductor light emitting device 140 may be induced to the third trap 150C, so that the micro-semiconductor light emitting device 140 may be more easily aligned in the second trap 150B. The third trap 150C has a size smaller than the second trap 150B, and a shape thereof is not particularly limited. The third trap 150C may be provided in plurality or may be omitted.

The first trap 150A may be set to a size having a space in which the micro-semiconductor light emitting device 140 may move. In addition, the size of the first trap 150A may be set such that one micro-semiconductor light emitting device 140 is disposed in one recess 150. For example, the size of the first trap 150A may be set so that two or more micro-semiconductor light emitting devices 140 cannot fit into the recess 150. The first trap 150A partially overlaps the circular second trap 150B and may have a shape in which a portion of the circle is cut out.

The second trap 150B may have a shape and size corresponding to those of the micro-semiconductor light emitting device 140. For example, the second trap 150B may have a shape and size in which the micro-semiconductor light emitting device 140 may be seated. The second trap 150B is large enough to accommodate the micro-semiconductor light emitting device 140 and may have substantially the same size as the micro-semiconductor light emitting device 140. For example, a width of the second trap 150B may be 100% or more, and 105% or less, 103% or less, or 101% or less of a width of the micro-semiconductor light emitting device 140. In addition, when the micro-semiconductor light emitting device 140 is circular, the second trap 150B may also have a circular shape or may have an oval or polygonal shape in which the circular micro-semiconductor light emitting device 140 may be inserted. When the micro-semiconductor light emitting device 140 has a quadrangular shape, the second trap 150B may also have a quadrangular shape or may have a circular, elliptical, or other polygonal shape in which the quadrangular micro-semiconductor light emitting device 140 may fit.

In the scanning process illustrated in FIGS. 10 and 11, when the absorber 10 scans the driving substrate 110 in a direction from the first trap 150A toward the second trap 150B, the micro-semiconductor light emitting device 140 may be more accurately seated in the second trap 150B. Because the second trap 150B has substantially the same size as the micro-semiconductor light emitting device 140, the micro-semiconductor light emitting devices 140 may be aligned in almost accurate positions in the entire area of the driving substrate 110.

Figure 14A:
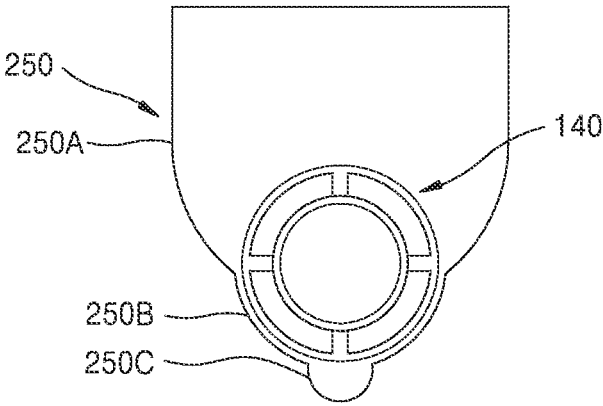
FIGS. 14A, 14B, and 14C illustrate shapes of various recesses according to example embodiments.
Figure 14B:
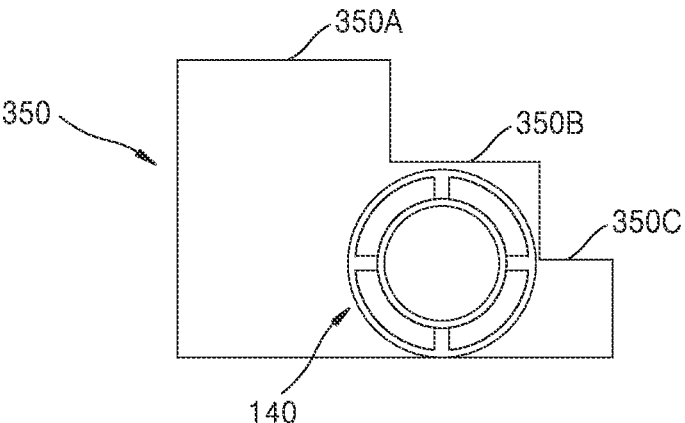
Figure 14C:
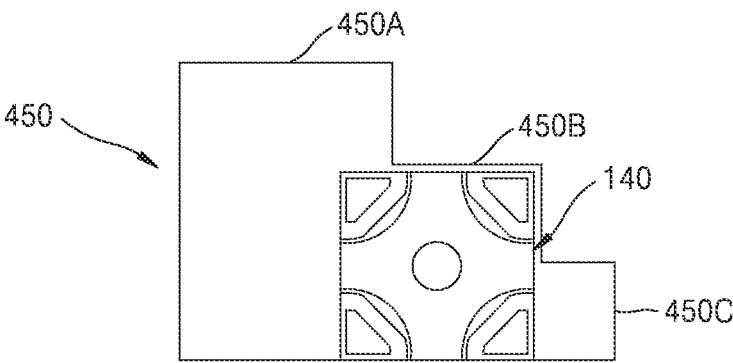

FIGS. 14A to 14C illustrate shapes of various recesses according to example embodiments. Referring to FIG. 14A, a recess 250 may include a first trap 250A, a second trap 250B, and a third trap 250C. The second trap 250B may have a circular shape, and the first trap 250A may have a shape in which one end thereof is deformed into a square shape. Referring to FIG. 14B, a first trap 350A, a second trap 350B, and a third trap 350C of a recess 350 may have a quadrangular shape, and a circular micro-semiconductor light emitting device 140 may be disposed in the second trap 350B. Also, referring to FIG. 14C, a first trap 450A, a second trap 450B, and a third trap 450C of a recess 450 may have a quadrangular shape, and the quadrangular micro-semiconductor light emitting device 140 may be disposed in the second trap 450B.

It has been described that the micro-semiconductor light emitting device 140 is directly aligned on the driving substrate 110 in a fluidic self-assembly method. However, embodiments are not limited thereto, and it is also possible to align the micro-semiconductor light emitting device 140 on a transfer substrate in a fluidic self-assembly method and subsequently transfer the micro-semiconductor light emitting device 140 on the transfer substrate onto the driving substrate 110. For example, FIGS. 15A to 15F are cross-sectional views illustrating a method of manufacturing a display device according to another example embodiment.

Figure 15A:
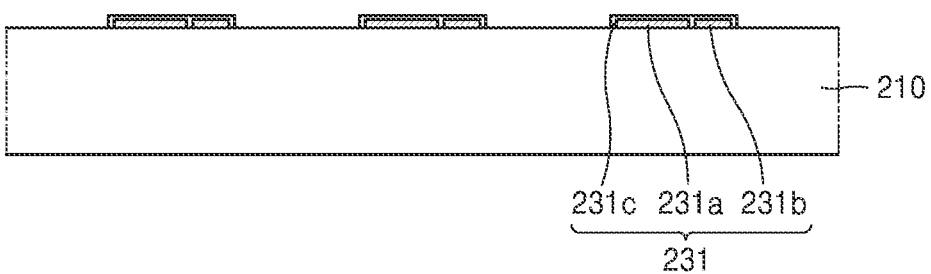
FIGS. 15A, 15B, 15C, 15D, 15E, and 15F are cross-sectional views illustrating a method of manufacturing a display device according to another example embodiment.

Referring to FIG. 15A, a lower reflective structure 231 may be first formed on an upper surface of a driving substrate 210. A plurality of lower reflective structures 231 may be formed in positions in which the micro-semiconductor light emitting devices 140 are to be disposed. The lower reflective structure 231 may be configured to also serve as an electrode pad. To this end, the lower reflective structure 231 may include a first reflective metal layer 231a, a second reflective metal layer 231b, and an insulating layer 231c disposed to cover the first and second reflective metal layers 231a and 231b. Although it is illustrated that the plurality of separated insulating layers 231c are disposed on the driving substrate 210 in FIG. 15A, embodiments are not limited thereto. For example, a single insulating layer 231c covering all of a plurality of first reflective metal layers 231a and a plurality of second reflective metal layers 231b may be formed on the driving substrate 210.

Figure 15B:
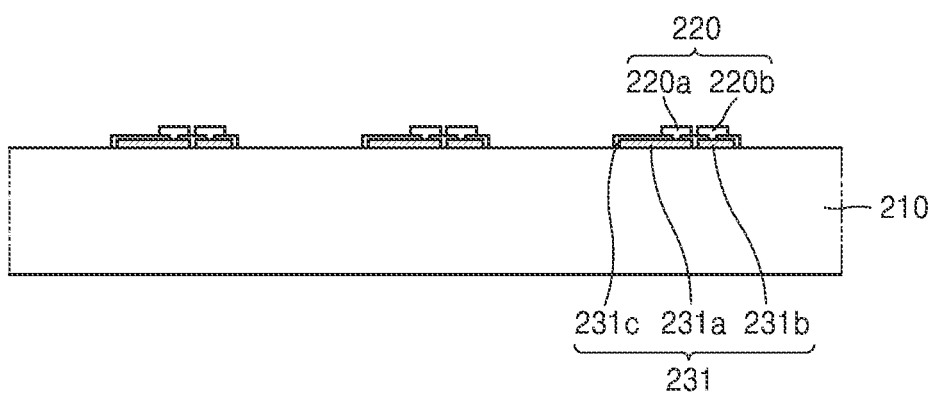

Referring to FIG. 15B, a through hole may be formed by penetrating through the insulating layer 231c in a vertical direction so that a portion of the first reflective metal layer 231a and a portion of the second reflective metal layer 231b are exposed. In addition, a bump layer 220 may be formed by filling the bump material in the through hole. The bump layer 220 may include a first bump layer 220a in contact with the first reflective metal layer 231a and a second bump layer 220b in contact with the second reflective metal layer 231b. The first bump layer 220a and the second bump layer 220b may partially extend on an upper surface of the insulating layer 231c and are apart from each other on the upper surface of the insulating layer 231c. The bump layer 220 may further include an under bump metallurgy (UBM) together with a bump material.

Figure 15C:
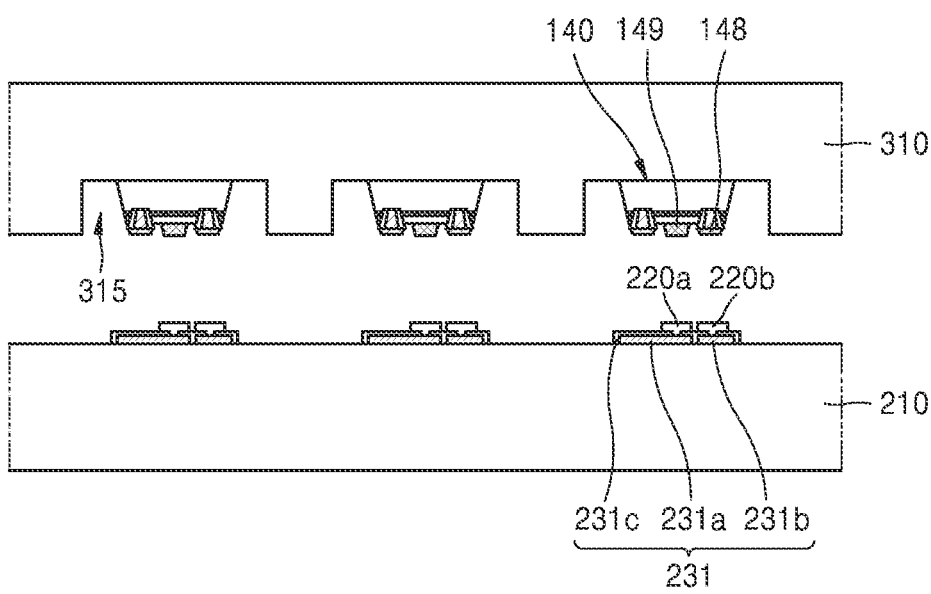

Referring to FIG. 15C, a transfer substrate 310 on which the micro-semiconductor light emitting devices 140 are aligned may be disposed on an upper surface of the driving substrate 210. The transfer substrate 310 may include a plurality of recesses 315, and the micro-semiconductor light emitting devices 140 are respectively seated in the recesses 315 using a fluidic self-assembly method. In particular, the micro-semiconductor light emitting device 140 may be aligned such that the first electrode 148 and the second electrode 149 thereof are disposed toward the outside of the recess 315. The transfer substrate 310 may be disposed such that the first and second electrodes 148 and 149 of the micro-semiconductor light emitting device 140 face the driving substrate 210. Then, the micro-semiconductor light emitting devices 140 aligned on the transfer substrate 310 may be transferred onto the driving substrate 210. Accordingly, the lower reflective structure 231 is disposed between each of the micro-semiconductor light emitting devices 140 and the driving substrate 210.

Figure 15D:
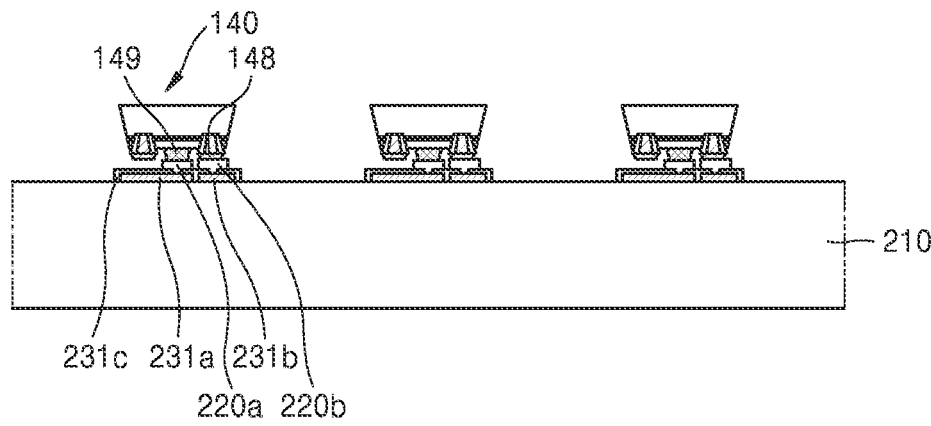

Referring to FIG. 15D, the first electrode 148 and the second electrode 149 of the micro-semiconductor light emitting device 140 transferred onto the driving substrate 210 may contact different bump layers, respectively. For example, the first electrode 148 of the micro-semiconductor light emitting device 140 may contact the second bump layer 220b, and the second electrode 149 may contact the first bump layer 220a. Then, the first electrode 148 of the micro-semiconductor light emitting device 140 may be electrically connected to the second reflective metal layer 231b through the second bump layer 220b, and the second electrode 149 may be electrically connected to the first reflective metal layer 231*a* through the first bump layer 220*a*. The first reflective metal layer 231*a* and the second reflective metal layer 231*b* may be electrically connected to a driving circuit inside the driving substrate 210, respectively.

Figure 15E:
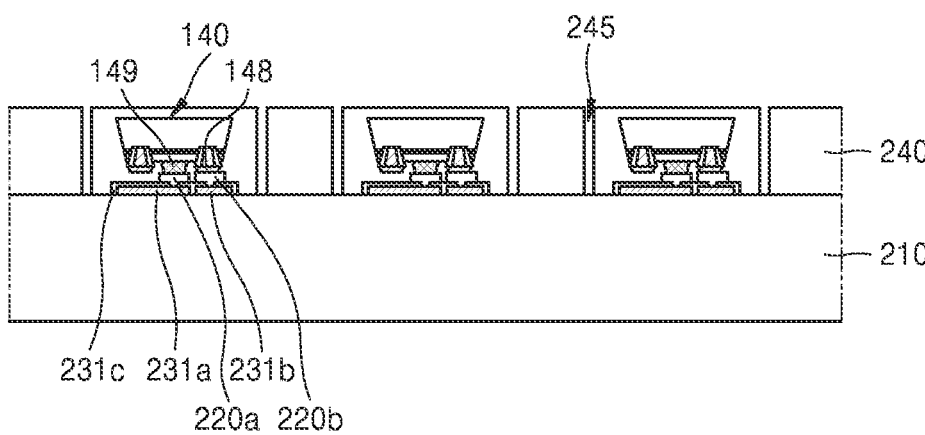

Referring to FIG. 15E, a transparent protective layer 240 may be formed to cover the driving substrate 210 and the micro-semiconductor light emitting device 140. The protective layer 240 may also be patterned to form a trench 245 to surround the periphery of each micro-semiconductor light emitting device 140. In FIG. 15E, it is illustrated that the trench 245 completely penetrates through the protective layer 240 in a vertical direction, but embodiments are not limited thereto. When the trench 245 completely penetrates through the protective layer 240, an upper surface of the driving substrate 210 may be exposed by the trench 245. According to another example embodiment, when one insulating layer 231*c* covering both the first reflective metal layer 231*a* and the second reflective metal layer 231*b* is formed on the driving substrate 210, the insulating layer 231*c* may be exposed by the trench 245. However, when the trench 245 does not completely penetrate through the protective layer 240, a bottom of the trench 245 may be formed in the lower portion of the protective layer 240 and the upper surface of the driving substrate 210 or the upper surface of the insulating layer 231*c* may not be exposed.

Figure 15F:
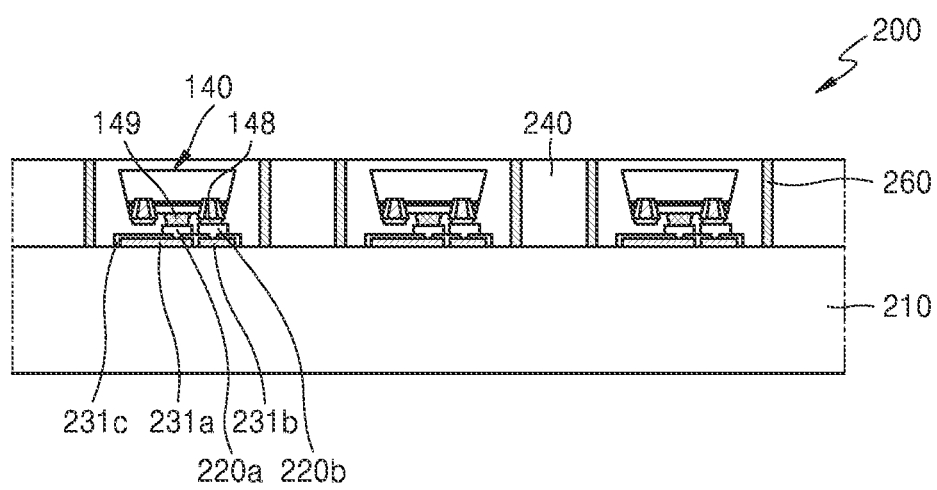

Referring to FIG. 15F, the trench 245 may be filled with a reflective metallic material to form a side reflective structure 260. The side reflective structure 260 may be disposed to surround the periphery of each micro-semiconductor light emitting device 140. The side reflective structure 260 may extend from an upper surface of the protective layer 240 to a lower surface of the protective layer 240 completely through the protective layer 240, but is not limited thereto. For example, the side reflective structure 260 may not penetrate through the protective layer 240 so that the lower surface of the side reflective structure 260 is surrounded by the lower portion of the protective layer 240. The side reflective structure 260 may be disposed not to contact the first reflective metal layer 231*a* or the second reflective metal layer 231*b*.

The display device 200 manufactured in the manner illustrated in FIGS. 15A to 15F is different from the display device described above in that the display device 200 does not include a barrier layer, and also, a direction in which the first and second electrodes 148 and 149 of the micro-semiconductor light emitting device 140 face and a corresponding wiring structure of the display device 200 are different from the display device described above. However, the configurations of the side reflective structure and the lower reflective structure described above with respect to the display device described above may be generally applied to the display device 200.

Figure 16:
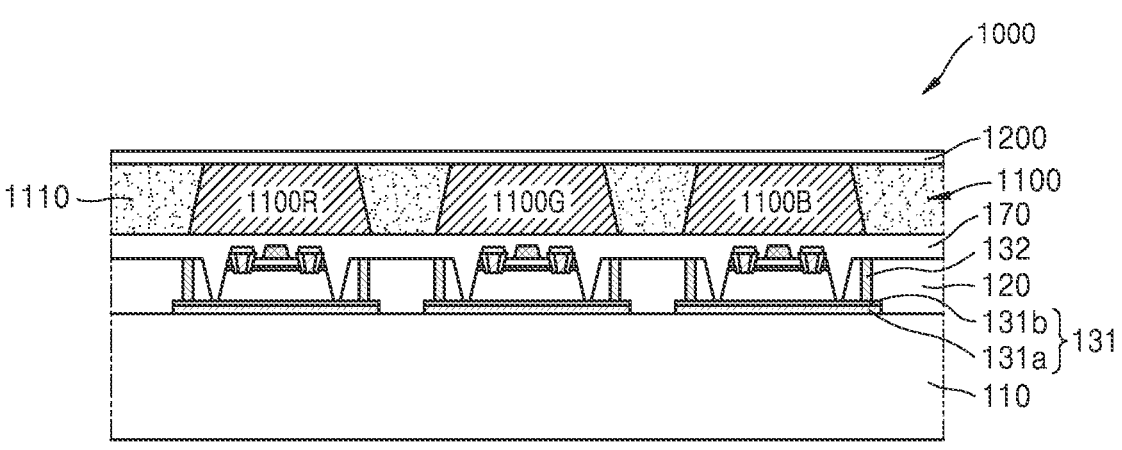
FIG. 16 is a cross-sectional view schematically illustrating a structure of a display device according to another example embodiment.

FIG. 16 is a cross-sectional view schematically illustrating a structure of a display device 1000 according to another example embodiment. Referring to FIG. 16, the display device 1000 may further include a wavelength conversion layer 1100 disposed on the protective layer 170 and an upper substrate 1200 disposed on the wavelength conversion layer 1100. In the display device 1000 illustrated in FIG. 16, a structure including the driving substrate 110 and the micro-semiconductor light emitting device 140 disposed below the protective layer 170 may be the same as the configuration of the display devices 100, 100*a*, 100*b*, and 200 described above. In FIG. 16, a wiring structure of the micro-semiconductor light emitting device 140 is omitted for convenience.

The wavelength conversion layer 1100 may include a first wavelength conversion layer 1100R converting light emitted from the micro-semiconductor light emitting device 140 into light having a first wavelength band, a second wavelength conversion layer 1100G converting the light into light having a second wavelength band, and a third wavelength conversion layer 1100B converting the light into light having a third wavelength band. For example, the light having the first wavelength band may be red light, the light having the second wavelength band may be green light, and the light having the third wavelength band may be blue light. The first wavelength conversion layer 1100R, the second wavelength conversion layer 11000, and the third wavelength conversion layer 1100B may be spaced apart from each other with the barrier 1110 therebetween and may face corresponding micro-semiconductor light emitting devices 140, respectively.

When the micro-semiconductor light emitting device 140 emits blue light, the third wavelength conversion layer 11006 may include a resin that transmits blue light. The second wavelength conversion layer 11000 may convert blue light emitted from the micro-semiconductor light emitting device 140 to emit green light. The second wavelength conversion layer 1100G may include quantum dots or phosphors excited by blue light to emit green light. The first wavelength conversion layer 1100R may change blue light emitted from the micro-semiconductor light emitting device 140 into red light to be emitted. The first wavelength conversion layer 1100R may include quantum dots or phosphors excited by blue light and emit red light.

The quantum dots included in the first wavelength conversion layer 1100R or the second wavelength conversion layer 1100G may have a core-shell structure having a core portion and a shell portion or may have a particle structure without a shell. The core-shell structure may include a single shell structure or a multi-shell structure, e.g., a double-shell structure. The quantum dots may include a group II-VI series semiconductor, a group III-V series semiconductor, a group IV-VI series semiconductor, a group IV series semiconductor, and/or graphene quantum dots. The quantum dots may include, for example, cadmium (Cd), selenium (Se), zinc (Zn), sulfur (S), and/or indium phosphide (InP), and each quantum dot may have a diameter of tens of nm or less, for example, a diameter of about 10 nm or less. The quantum dots included in the first wavelength conversion layer 1100R and the second wavelength conversion layer 11000 may have different sizes.

Figure 17:
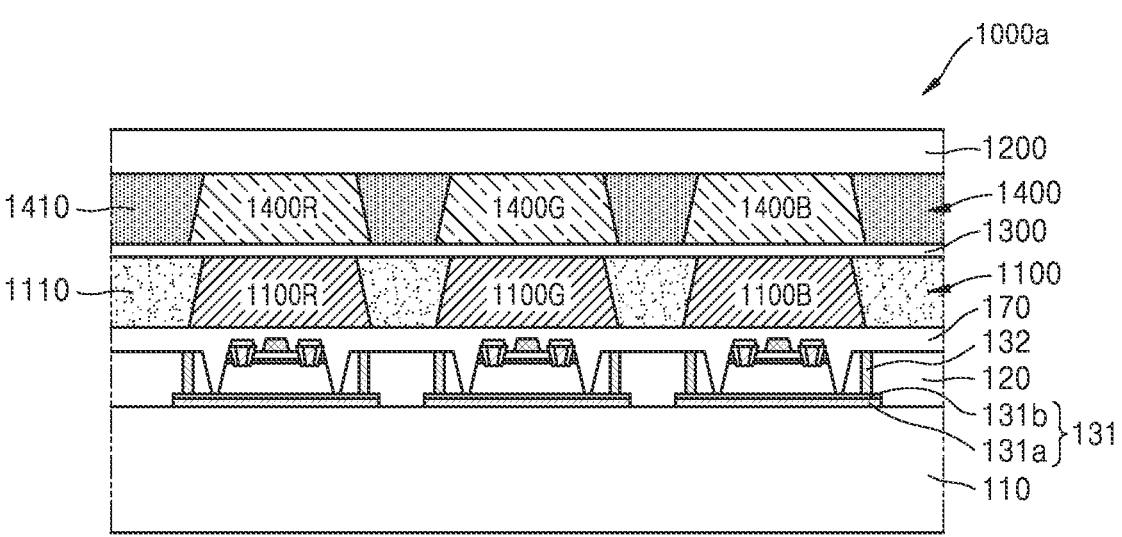
FIG. 17 is a cross-sectional view schematically illustrating a structure of a display device according to another example embodiment.

FIG. 17 is a cross-sectional view schematically illustrating a structure of a display device 1000*a* according to another example embodiment. Referring to FIG. 17, the display device 1000*a* may further include a capping layer 1300 on the wavelength conversion layer 1100 and a color filter layer 1400 on the capping layer 1300. The capping layer 1300 and the color filter layer 1400 may be disposed between the wavelength conversion layer 1100 and the upper substrate 1200 of the display device 1000 illustrated in FIG. 16. The color filter layer 1400 includes a first filter 1400R, a second filter 1400G, and a third filter 1400B apart from each other with a black matrix 1410 therebetween. The first filter 1400R, the second filter 1400G, and the third filter 1400B face the first wavelength conversion layer 1100R, the second wavelength conversion layer 1100G, and the third wavelength conversion layer 1100B, respectively. The first filter 1400R, the second filter 1400G, and the third filter 1400B transmit red light, green light, and blue light, respectively, and absorb light of other colors. When the color filter layer 1400 is provided, light other than red light emitted without wavelength conversion from the first wavelength conversion layer 1100R or light other than green light emitted without wavelength conversion from the second color conversion layer 11000 may be removed by the first filter 1400R and the second filter 1400G, respectively, thereby increasing color purity of the display device 1000a.

Figure 18:
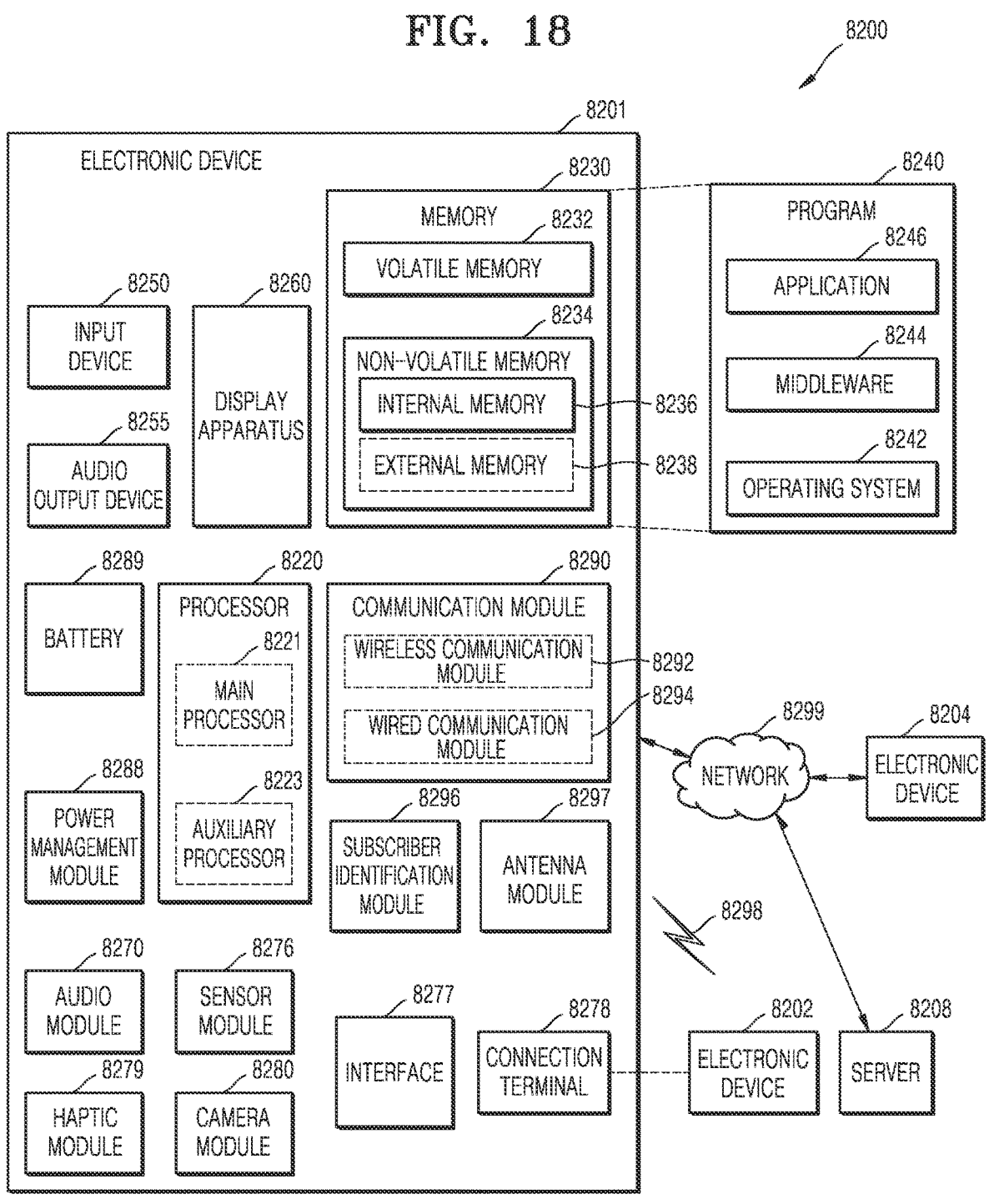
FIG. 18 is a schematic block diagram of an electronic device according to an example embodiment.

The display devices described above may be applied to various electronic devices having a screen display function. FIG. 18 is a schematic block diagram of an electronic device according to an example embodiment. Referring to FIG. 18, the electronic device 8201 may be provided in a network environment 8200. In the network environment 8200, the electronic device 8201 may communicate with another electronic device 8202 through a first network 8298 (a short-range wireless communication network, etc.), or may communicate with another electronic device 8204 and/or a server 8208 through a second network 8299 (a long-range wireless communication network, etc.). The electronic device 8201 may communicate with the electronic device 8204 through the server 8208. The electronic device 8201 may include a processor 8220, a memory 8230, an input device 8250, an audio output device 8255, a display device 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. Some of these components of the electronic device 8201 may be omitted or other components may be added to the electronic device 8201. Some of these components may be implemented as one integrated circuit. For example, the sensor module 8276 (a fingerprint sensor, an iris sensor, an illuminance sensor, etc.) may be included in the display device 8260 (display, etc.).

The processor 8220 may execute software (a program 8240, etc.) to control one or a plurality of other components (hardware, software components, etc.) among the electronic devices 8201 connected to the processor 8220 and perform various data processing or operations. As part of the data processing or operations, the processor 8220 may load instructions and/or data received from other components (the sensor module 8276, the communication module 8290, etc.) into a volatile memory 8232, process instructions and/or data stored in the volatile memory 8232, and store result data in a nonvolatile memory 8234. The nonvolatile memory 8234 may include an internal memory 8236 mounted in the electronic device 8201 and a detachable external memory 8238. The processor 8220 may include a main processor 8221 (central processing unit, application processor, etc.) and an auxiliary processor 8223 (graphics processing unit, image signal processor, sensor hub processor, communication processor, etc.) that may be operated independently or together with the main processor 8221. The auxiliary processor 8223 may use less power than the main processor 8221 and may perform specialized functions. The auxiliary processor 8223 may use less power than the main processor 8221 and may perform specialized functions.

The auxiliary processor 8223 may control functions and/or states related to some (the display device 8260, the sensor module 8276, the communication module 8290, etc.) of the components of the electronic device 8201 in place of the main processor 8221 while the main processor 8221 is inactive (a sleep state) or together with the main processor 8221 while the main processor 8221 is active (an application executed state). The auxiliary processor 8223 (an image signal processor, a communication processor, etc.) may be implemented as part of other functionally related components (the camera module 8280, the communication module 8290, etc.).

The memory 2230 may store various data required by the components (the processor 8220, the sensor module 8276, etc.) of the electronic device 8201. The data may include, for example, software (the program 8240, etc.) and input data and/or output data for commands related thereto. The memory 8230 may include the volatile memory 8232 and/or the nonvolatile memory 8234.

The program 8240 may be stored as software in the memory 8230 and may include an operating system 8242, middleware 8244, and/or an application 8246.

The input device 8250 may receive commands and/or data to be used by components (the processor 8220, etc. of the electronic device 8201) from the outside (a user, etc.) of the electronic device 8201. The input device 8250 may include a remote controller, a microphone, a mouse, a keyboard, and/or a digital pen (such as a stylus pen).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive incoming calls. The receiver may be combined as part of the speaker or may be implemented as an independent separate device.

The display device 8260 may visually provide information to the outside of the electronic device 8201. The display device 8260 may include a display, a hologram device, or a projector, and a control circuit for controlling a corresponding device. The display device 8260 may include the driving circuit, the micro-semiconductor light emitting device, the side reflective structure, the lower reflective structure, etc. The display device 8260 may further include touch circuitry configured to detect a touch and/or a sensor circuit (a pressure sensor, etc.) configured to measure the strength of a force generated by the touch.

The audio module 8270 may convert sound into an electrical signal, or conversely, may convert an electrical signal into sound. The audio module 8270 may acquire sound through the input device 8250 and output sound through a speaker and/or a headphone of another electronic device (the electronic device 8202, etc.) connected to the audio output device 8255 and/or the electronic device 8201 directly or wirelessly.

The sensor module 8276 may detect an operating state (power, temperature, etc.) of the electronic device 8201 or an external environmental state (a user state, etc.), and generate an electrical signal and/or data value corresponding to the detected state. The sensor module 8276 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols that may be used for the electronic device 8201 to be connected to another electronic device (e.g, the electronic device 8202) directly or wirelessly. The interface 8277 may include a high definition multimedia interface (HDMI), a universal serial bus (USB) interface, an SD card interface, and/or an audio interface.

A connection terminal 8278 may include a connector through which the electronic device 8201 may be physically connected to another electronic device (such as the electronic device 8202). The connection terminal 8278 may include an HDMI connector, a USB connector, an SD card connector, and/or an audio connector (such as a headphone connector).

The haptic module 8279 may convert an electrical signal into a mechanical stimulus (vibration, movement, etc.) or an electrical stimulus that a user may perceive through a tactile or motor sense. The haptic module 8279 may include a motor, a piezoelectric element, and/or an electrical stimulation device.

The camera module 8280 may capture a still image and video. The camera module 8280 may include a lens assembly including one or more lenses, image sensors, image signal processors, and/or flashes. The lens assembly included in the camera module 8280 may collect light emitted from a subject to be imaged.

The power management module 8288 may manage power supplied to the electronic device 8201. The power management module 8288 may be implemented as part of a power management integrated circuit (PMIC).

The battery 8289 may supply power to components of the electronic device 8201. The battery 8289 may include a non-rechargeable primary cell, a rechargeable secondary cell, and/or a fuel cell.

The communication module 8290 may establish a direct (wired) communication channel and/or a wireless communication channel between the electronic device 8201 and other electronic devices (the electronic device 8202, the electronic device 8204, the server 8208, etc.) and support communication through the established communication channel. The communication module 8290 may include one or more communication processors operating independently of the processor 8220 (an application processor, etc.) and supporting direct communication and/or wireless communication. The communication module 8290 may include a wireless communication module 8292 (a cellular communication module, a short-range wireless communication module, a global navigation satellite system (GNSS) communication module, etc.) and/or a wired communication module 8294 (a local area network (LAN) communication module, a power line communication module, etc.). Among these communication modules, a corresponding communication module may communicate with another electronic device through the first network 8298 (a short-range communication network such as Bluetooth, WiFi Direct, or infrared Data Association (IrDA) or the second network 8299 (a telecommunication network such as a cellular network, the Internet, or a computer network (LAN), WAN, etc.). These various types of communication modules may be integrated into one component (a single chip, etc.) or may be implemented as a plurality of components (multiple chips) separate from each other. The wireless communication module 8292 may verify and authenticate the electronic device 8201 in the communication network such as the first network 8298 and/or the second network 8299 using subscriber information (an international mobile subscriber identifier (IMSI), etc.) stored in the subscriber identification module 8296.

The antenna module 8297 may transmit signals and/or power to the outside (such as other electronic devices) or receive signals and/or power from the outside. The antenna may include a radiator including a conductive pattern formed on a board (a printed circuit board (PCB), etc.). The antenna module 8297 may include one or a plurality of antennas. When a plurality of antennas are included, an antenna suitable for a communication method used in a communication network such as the first network 8298 and/or the second network 8299 may be selected from among the plurality of antennas by the communication module 8290. Signals and/or power may be transmitted or received between the communication module 8290 and other electronic devices through the selected antenna. A component (an RFIC, etc.) other than the antenna may be included as part of the antenna module 8297.

Some of the components may be connected to each other through communication methods (a bus, a general purpose input and output (BPIO), a serial peripheral interface (SPI), a mobile industry processor interface (MIPI)) and exchange signals (commands, data, etc.) with each other.

The command or data may be transmitted or received between the electronic device 8201 and the electronic device 8204 through the server 8208 connected to the second network 8299. The other electronic devices 8202 and 8204 may be the same or different types of devices as the electronic device 8201. All or some of the operations executed by the electronic device 8201 may be executed by one or more of the other electronic devices 8202, 8204, and 8208. For example, when the electronic device 8201 needs to perform a function or service, the electronic device 8201 may request one or more other electronic devices to perform a portion or the entirety of the function or the service, instead of executing the function or service by itself. Upon receiving the request, one or more other electronic devices may execute an additional function or service related to the request, and transmit a result of the execution to the electronic device 8201. To this end, cloud computing, distributed computing, and/or client-server computing technology may be used.

Figure 19:
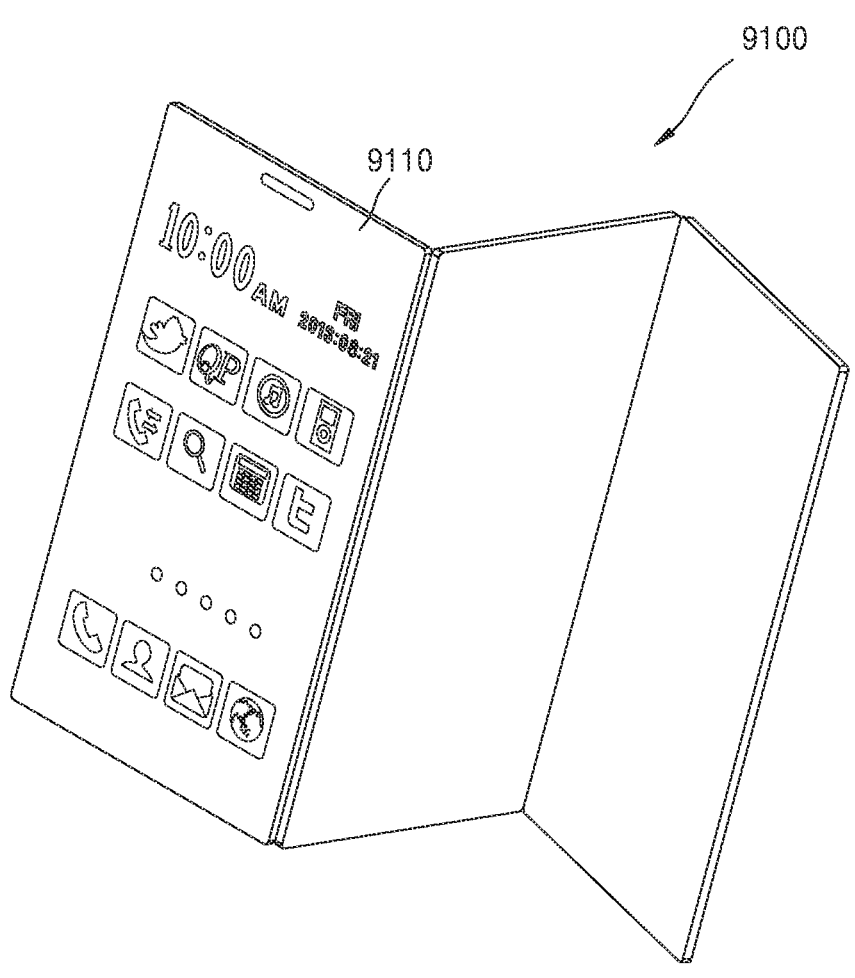
FIG. 19 illustrates an example in which a display device according to example embodiments is applied to a mobile device.

FIG. 19 illustrates an example in which a display device according to example embodiments is applied to a mobile device 9100. The mobile device 9100 may include a display device 9110, and the display device 9110 may include the driving circuit, the micro-semiconductor light emitting device, the side reflective structure, the lower reflective structure, and the like described above. The display device 9110 may have a foldable structure, for example, a multi-foldable structure.

Figure 20:
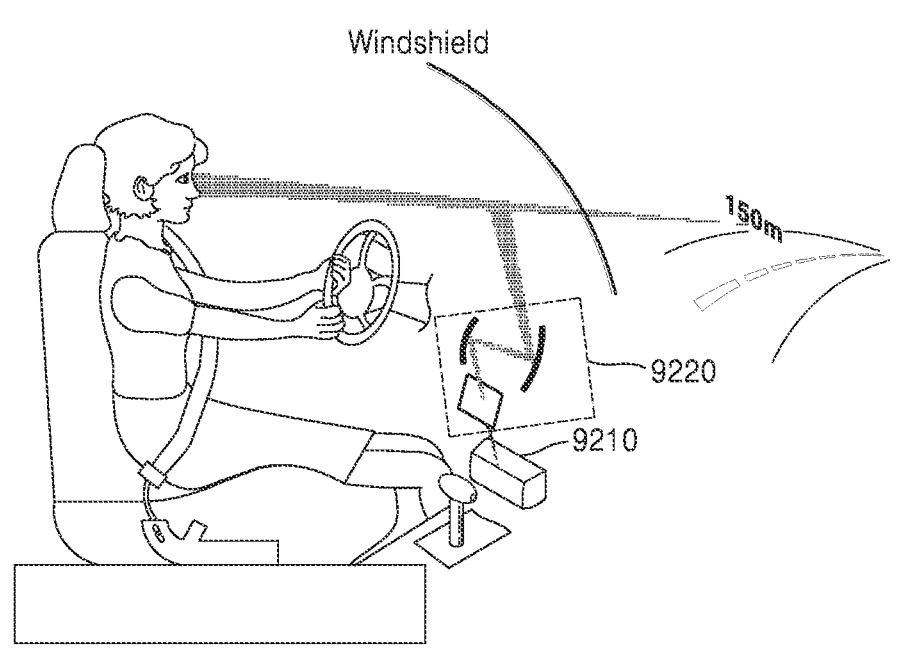
FIG. 20 illustrates an example in which a display device according to the example embodiments is applied to a vehicle display device.

FIG. 20 illustrates an example in which the display device according to the example embodiments is applied to a vehicle display device. The display device may be a head-up display device 9200 for a vehicle and may include a display 9210 provided in a region of a vehicle and a light path changing member 9220 for changing a path of light so that a driver may see an image generated by the display 9210.

Figure 21:
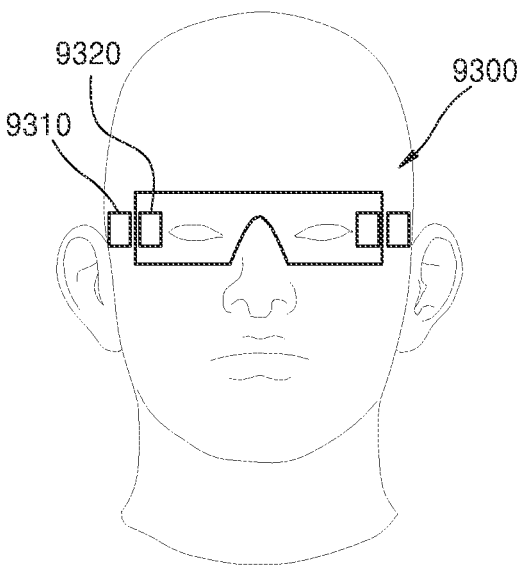
FIG. 21 illustrates an example in which a display device according to example embodiments is applied to augmented reality glasses or virtual reality glasses.

FIG. 21 illustrates an example in which the display device according to example embodiments is applied to augmented reality (AR) glasses 9300 or virtual reality glasses. The AR glasses 9300 may include a projection system 9310 forming an image and an element 9320 guiding the image from the projection system 9310 to a user's eye. The projection system 9310 may include the driving circuit, the micro-semiconductor light emitting device, the side reflective structure, the lower reflective structure, and the like described above.

Figure 22:
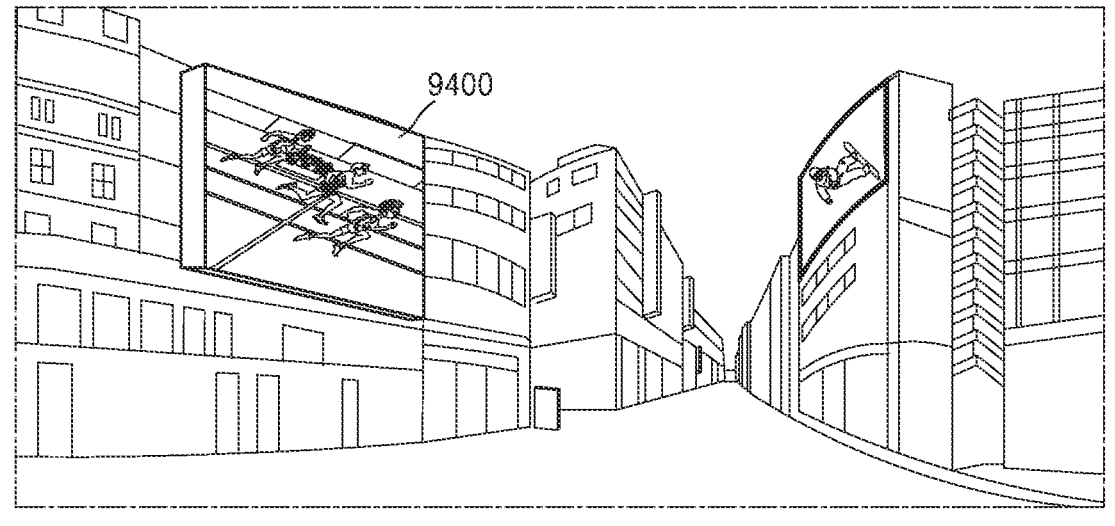
FIG. 22 illustrates an example in which a display device according to the example embodiments is applied to a signage.

FIG. 22 illustrates an example in which the display device according to example embodiments is applied to a signage 9400. The signage 9400 may be used for outdoor advertisements using a digital information display and may control advertisement content and the like through a communication network. The signage 9400 may be implemented, for example, through the electronic device described above with reference to FIG. 18.

Figure 23:
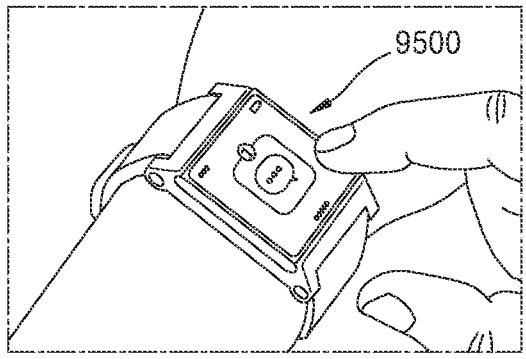
FIG. 23 illustrates an example in which a display device according to example embodiments is applied to a wearable display.

FIG. 23 illustrates an example in which the display device according to example embodiments is applied to a wearable display 9500. The wearable display 9500 may include the driving circuit, the micro-semiconductor light emitting device, the side reflective structure, the lower reflective structure, and the like described above and may be implemented through the electronic device described above with reference to FIG. 18.

The display device according to an example embodiment may be applied to various products such as a rollable television (TV), a stretchable display, etc.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. A display device comprising:
a driving substrate comprising a driving circuit;
a barrier layer disposed on an upper surface of the driving substrate and including a plurality of recesses;
a micro-semiconductor light emitting device disposed in each of the plurality of recesses;
a side reflective structure disposed in the barrier layer and provided adjacent to a sidewall of each of the plurality of recesses; and
a lower reflective structure on a bottom surface of each of the plurality of recesses,
wherein the side reflective structure is spaced apart from the driving substrate,
wherein an uppermost surface of the side reflective structure opposite to the driving substrate is coplanar to an upper surface of the barrier layer, and a bottom surface of the micro-semiconductor light emitting device is coplanar to a bottom surface of the side reflective structure,
wherein the lower reflective structure comprises a reflective metal layer and an insulating layer disposed on the reflective metal layer, the insulating layer having a hydrophilic surface,
wherein an upper surface of the insulating layer is in contact with a lower surface of the side reflective structure, and
wherein a width of the reflective metal layer is larger than a width of the micro-semiconductor light emitting device such that the reflective metal layer faces an entire bottom surface of the micro-semiconductor light emitting device and extends continuously across the entire bottom surface of the micro-semiconductor light emitting device.

2. The display device of claim 1, wherein the side reflective structure is disposed such that the sidewall of each of the plurality of recesses is disposed between the micro-semiconductor light emitting device and the side reflective structure, and
wherein a distance from the sidewall of each of the plurality of recesses to the side reflective structure is within a range from 0.1 μm to 50 μm.

3. The display device of claim 1, wherein a width of the side reflective structure in a direction parallel to the upper surface of the driving substrate is within a range from 1 μm to a value smaller than a width of the micro-semiconductor light emitting device.

4. The display device of claim 1, wherein the side reflective structure includes a metallic material.

5. The display device of claim 1, wherein the side reflective structure extends from the upper surface of the barrier layer to a lower surface of the barrier layer.

6. The display device of claim 1, wherein the side reflective structure is configured to reflect light emitted from the micro-semiconductor light emitting device.

7. The display device of claim 1, wherein an area of the lower reflective structure is larger than an area of each of the plurality of recesses, and a portion of the barrier layer is disposed above a portion of an upper surface of the lower reflective structure.

8. The display device of claim 7, wherein the lower reflective structure is disposed such that the upper surface of the lower reflective structure is in contact with the lower surface of the side reflective structure.

9. The display device of claim 1, wherein a thickness of the reflective metal layer in a normal direction of the upper surface of the driving substrate is within a range of 50 nm to 1 μm.

10. The display device of claim 1, wherein the reflective metal layer includes at least one of metals among aluminum (Al) or silver (Ag).

11. The display device of claim 1, further comprising a hydrophobic pattern disposed on the upper surface of the barrier layer and including a material same as a material of the side reflective structure.

12. The display device of claim 1, wherein a lower surface of the micro-semiconductor light emitting device in contact with the bottom surface of each of the plurality of recesses has hydrophilicity.

13. The display device of claim 12, wherein the micro-semiconductor light emitting device comprises a first electrode and a second electrode disposed on an upper surface thereof.

14. The display device of claim 1, wherein each of the plurality of recesses comprises a first trap region having a space in which the micro-semiconductor light emitting device moves and a second trap region having a shape and size in which the micro-semiconductor light emitting device is seated, the second trap region being connected to the first trap region.

15. The display device of claim 14, wherein a size of the first trap region is set such that two or more of the micro-semiconductor light emitting devices do not enter each of the plurality of recesses.

16. The display device of claim 14, wherein a width of the second trap region is within a range from 100% to about 105% of a width of the micro-semiconductor light emitting device.

17. The display device of claim 1, further comprising a wavelength conversion layer configured to convert a wavelength of light emitted from the micro-semiconductor light emitting device.

18. A display device comprising:
a driving substrate comprising a driving circuit;
a plurality of micro-semiconductor light emitting devices disposed on an upper surface of the driving substrate;
a protective layer disposed on the upper surface of the driving substrate and the plurality of micro-semiconductor light emitting devices;
a side reflective structure disposed inside the protective layer and adjacent to a periphery of each of the plurality of micro-semiconductor light emitting devices; and a lower reflective structure between a bottom surface of each of the plurality of micro-semiconductor light emitting devices and the upper surface of the driving substrate, wherein the side reflective structure is spaced apart from the driving substrate, wherein an uppermost surface of the side reflective structure opposite to the driving substrate is coplanar to an upper surface of the protective layer, and the bottom surface of each of the plurality of micro-semiconductor light emitting devices is coplanar to a bottom surface of the side reflective structure, wherein the lower reflective structure comprises a reflective metal layer and an insulating layer disposed on the reflective metal layer, the insulating layer having a hydrophilic surface, wherein an upper surface of the insulating layer is in contact with a lower surface of the side reflective structure, and wherein a width of the reflective metal layer is larger than a width of the micro-semiconductor light emitting device such that the reflective metal layer faces an entire bottom surface of the micro-semiconductor light emitting device and extends continuously across the entire bottom surface of the micro-semiconductor light emitting device.

19. The display device of claim 18, wherein a width of the side reflective structure in a direction parallel to the upper surface of the driving substrate is within a range from 1 μm to a value smaller than a width of each of the plurality of micro-semiconductor light emitting devices.

20. The display device of claim 18, wherein the side reflective structure includes a metallic material.

21. The display device of claim 18, wherein the side reflective structure extends from the upper surface of the protective layer to a lower surface of the protective layer.

22. The display device of claim 18, wherein each of the plurality of micro-semiconductor light emitting devices comprises a first electrode and a second electrode disposed on a surface.

* * * * *